US008259293B2

(12) United States Patent
Andreou et al.

(10) Patent No.: US 8,259,293 B2
(45) Date of Patent: Sep. 4, 2012

(54) DEEP SUBMICRON AND NANO CMOS SINGLE PHOTON PHOTODETECTOR PIXEL WITH EVENT BASED CIRCUITS FOR READOUT DATA-RATE REDUCTION COMMUNICATION SYSTEM

(75) Inventors: Andreas G. Andreou, Baltimore, MD (US); Miriam Adlerstein Marwick, Baltimore, MD (US); Philippe O. Pouliquen, Baltimore, MD (US)

(73) Assignee: Johns Hopkins University, Baltimore, MD (US)

( * ) Notice: Subject to any disclaimer, the term of this patent is extended or adjusted under 35 U.S.C. 154(b) by 230 days.

(21) Appl. No.: 12/531,191

(22) PCT Filed: Mar. 17, 2008

(86) PCT No.: PCT/US2008/057205
§ 371 (c)(1),
(2), (4) Date: May 14, 2010

(87) PCT Pub. No.: WO2008/113067
PCT Pub. Date: Sep. 18, 2008

(65) Prior Publication Data
US 2010/0245809 A1    Sep. 30, 2010

Related U.S. Application Data

(60) Provisional application No. 60/918,268, filed on Mar. 15, 2007.

(51) Int. Cl.
*G01J 1/42* (2006.01)
(52) U.S. Cl. ...................................... 356/222
(58) Field of Classification Search .................. None
See application file for complete search history.

(56) References Cited

U.S. PATENT DOCUMENTS

| 5,859,450 | A | 1/1999 | Clark et al. |
| 6,384,663 | B2 | 5/2002 | Cova et al. |
| 6,541,752 | B2 | 4/2003 | Zappa et al. |
| 6,797,581 | B2 | 9/2004 | Vickers |
| 6,995,444 | B2 | 2/2006 | Cova et al. |
| 2006/0046675 | A1* | 3/2006 | Speth et al. ............... 455/214 |
| 2006/0192086 | A1 | 8/2006 | Niclass et al. |
| 2006/2022129 | | 9/2006 | Niclass et al. |

OTHER PUBLICATIONS

J. Jackson, D. Phelan, A. Morrison, R. Redfern, and A. Mathewson, "Characterization of geiger mode avalanche photodiodes for fluorescence decay measurements," Proc. of SPIE, vol. 4650, No. 7, Jan. 2002.

(Continued)

*Primary Examiner* — Tu Nguyen
(74) *Attorney, Agent, or Firm* — Lowenstein Sandler PC

(57) ABSTRACT

An avalanche photodiode is disclosed. The avalanche photodiode includes a substrate of a first conductivity type. A first well of a second conductivity type is formed within the substrate. A second well of the second conductivity type is formed substantially overlying and extending into the first well. A heavily doped region of the first conductivity type is formed substantially overlying and extending into the first well, the junction between the heavily doped region and the second well forming an avalanche multiplication region. A guard ring is formed from a first conductivity material positioned substantially about the periphery of the multiplication region at least partially underlying the heavily doped region. An outer well ring of the second conductivity type is formed about the perimeter of the deep well and the guard ring.

24 Claims, 19 Drawing Sheets

OTHER PUBLICATIONS

A. Rochas, A. Pauchard, P. Besse, D. Pantic, Z. Prijic, and R. Popovic, "Low noise silicon avalanche photodiodes fabricated in conventional cmos technologies," IEEE Transactions on Electron Devices, vol. 49, No. 3, pp. 387-393, Mar. 2002.

B. Aull, A. Loomis, D. Young, R. Heinrichs, B. Felton, P. Daniels, and D. Landers, "Geiger mode avalanche photodiodes for three-dimensional imaging," Lincoln Laboratory Journal, vol. 13, No. 2, pp. 335-345, 2002.

A. Rochas, M. Gosch, A. Serov, P. Besse, R. Popovic, T. Lasser, and R. Rigler, "First fully integrated 2-D array of single-photon detectors in standard CMOS technology," IEEE Photon (Cs Technology Letters, vol. 15, No. 7, pp. 963-965, Jul. 2003.

M. Sergio and E. Charbon, "An intra-chip electro-optical channel Based on CMOS Single Photon Detectors," IEDM Technical Digest, pp. 819-822, Dec. 2005.

C. Niclass, M. Sergio, and E. Charbon, "A single photon avalanche diode array fabricated in deep submicron technology," Design Automation and Test Europe Conference, Mar. 2006.

H. Finkelstein, M. J. Hsu; and S. C. Esener, "Sti-bounded single-photon avalanche diode in a deep-submicrometer cmos technology," Electron Device Letters, vol. 27, No. 11, pp. 887-889, Nov. 2006.

S. Cova, M. Ghioni, A. Lacaita, C. Samori, and F. Zappa, "Avalanche photodiodes and quenching circuits for single-photon detection," Appl. Opt., vol. 35, pp. 1956-1976, 1996.

G. Tao, "Reliability issues in advanced monolithic embedded high voltage CMOS technologies," IEEE International Integrated Reliability Workshop, 2004.

Y. Taur, D. Buchanan, W. Chen, D. Frank, K. Ismail, S. Lo, G. Sai-Halasz, R. Viswanathan, H. C. Wann, S. Wind, and H. Wong, "CMOS scaling into the nanometer regime," Proceedings of the IEEE, vol. 85, No. 486-504, 1997.

PCT/US2008/057205 International Search Report dated Sep. 22, 2008.

* cited by examiner

US 8,259,293 B2

DEEP SUBMICRON AND NANO CMOS SINGLE PHOTON PHOTODETECTOR PIXEL WITH EVENT BASED CIRCUITS FOR READOUT DATA-RATE REDUCTION COMMUNICATION SYSTEM

CROSS-REFERENCE TO RELATED APPLICATIONS

This application is a U.S. National Phase Application of PCT International Application No. PCT/US2008/057205, filed Mar. 17, 2008, now published as WO 2008/113067, which claims the benefit of U.S. provisional patent application No. 60/918,268 filed Mar. 15, 2007, the disclosure of which is incorporated herein by reference in its entirety.

FIELD OF THE INVENTION

The present invention relates generally to sensor arrays, and more particularly to a deep submicron and nano CMOS-fabricated avalanche photodiode design and resulting pixel for incorporation into one and two dimensional sensor arrays.

BACKGROUND OF THE INVENTION

Optical sensors for extreme low-level light conditions can convert single photons into a measurable electrical signal. Single-photon detectors, as these sensors are called, can be employed in vision systems with 3D imaging and range capability, for sensing at night or in caves, for low data rate intra- and inter-platform communications, and for molecular sensing in bio-analytical fluorescence imaging. One of the first technologies in the prior art capable of sensing single photons are photomultiplier tubes (PMT). Unfortunately, PMTs are bulky, easily damaged, expensive, susceptible to magnetic fields, and require high voltages for operation.

Another technology capable of converting single photons to a measurable electrical signal is avalanche photodiodes. An avalanche photodiode can be made to detect single photons when operated above its breakdown voltage in what is known as Geiger mode in which a single incident photon can trigger an "infinite" amount of photocurrent. Since any generated carrier, wanted or otherwise, can trigger an "infinite" amount of photocurrent, an avalanche photodiode that operates in Geiger mode should meet stringent dark current and noise requirements to operate above breakdown. A design of such an avalanche photodiode should guarantee that the pn junction that forms the multiplication region of the diode has the lowest breakdown voltage of any two abutting regions which in general will have doping levels that are different. Further, premature breakdown along any edges or corners of the primary junction that forms the multiplication region should be prevented. In the past, specialized fabrication steps were needed to meet these requirements, but in recent years, single-photon avalanche detectors (SPAD) made from avalanche photodiodes that operate in Geiger mode and manufactured using CMOS processes have been demonstrated.

The earliest approach to fabricating arrays of SPADs in CMOS used a custom process which integrated the SPADs with a companion CMOS timing chip using backside bridge bonding, as found in B. Aull, A. Loomis, D. Young, It Heinrichs, B. Felton, P. Daniels, and D. Landers, "*Geiger mode avalanche photodiodes for three-dimensional imaging*," Lincoln Laboratory Journal, vol. 13, no. 2, pp. 335-345, 2002. The resulting arrays were limited in size to 32×32 pixels, and required significant post-processing to connect readout circuitry. In A. Rochas, M. Gosch, A. Serov, P. Besse, R. Popovic, T. Lasser, and R. Rigler, "*First fully integrated 2-D array of single-photon detectors in standard CMOS technology*," IEEE Photonics Technology Letters, vol. 15, no. 7, pp. p963-965, July 2003 and M. Sergio and E. Charbon, "*An Intra-chip electro-optical channel*," IEDM Technical Digest, pp. 819-822, December 2005, integrated SPADs have been demonstrated using high voltage CMOS processes. High voltage CMOS processes include special fabrication layers to allow the design of high voltage device structures necessary for the detector and the circuit elements in the pixel. Unfortunately, commercially available SPADs manufactured using high voltage CMOS processes suffer from reliability issues that limit the technology to feature sizes that are not competitive with low-voltage deep submicron and nano CMOS. This limits the ultimate density and usability of SPAD arrays manufactured using high voltage CMOS processes, to applications that do not require high quality or dense detector arrays. Fabrication steps that work to guarantee high breakdown voltages and eliminate latch-up often introduce leakage problems at crucial device interfaces. A Geiger mode CMOS SPAD manufactured using a non-high-voltage standard CMOS process employing a shallow-trench isolated structure is described in H. Finkelstein, M. J. Hsu, and S. C. Esener, "*STI-bounded single-photon avalanche diode in a deep-sub-micrometer CMOS technology*," Electron Device Letters, vol. 27, no. 11, pp. 887-889, November 2006. This structure has a very high dark count, one of the basic figures of merit for SPADs. The high dark count is likely the result of using STI material to form a guard ring, which creates a poor material interface at a crucial location inside the device and fails to buffer the bottom corners of the multiplication region from undesirable edge effects. Note that the periphery area is much smaller than the bottom area of the device, and the undesirable effects on the bottom of the device will dominate and dictate its characteristics.

Accordingly, what would be desirable, but has not yet been provided, is a single photon avalanche photodiode pixel which can be formed into high density arrays, manufactured using standard foundry, non-customized, CMOS processes and exhibits few dark counts even at room temperature. It would also be desirable to manufacture such a pixel in a standard deep sub-micron and nano CMOS foundry using existing design rules so as to produce cost effective solutions for signal and information processing sub-systems that handle data from detector pixels and operate at speeds that are only achievable using CMOS circuits fabricated using deep submicron and nano CMOS technologies. What is also desirable is a mixed signal pixel that can be switched from single photon counting to a digital state holding pixel to accommodate high rate photon flux and effectively provide for infinite dynamic range sensing.

SUMMARY OF THE INVENTION

The above-described problems are addressed and a technical solution is achieved in the art by providing an avalanche photodiode comprising a substrate of a first conductivity type; a first well of a second conductivity type formed within the substrate; a second well of the second conductivity type formed substantially overlying and extending into the first well; a heavily doped region of the first conductivity type formed substantially overlying and extending into the first well, the junction between the heavily doped region and the second well forming an avalanche multiplication region; a guard ring formed from a first conductivity material positioned substantially about the periphery of the multiplication region at least partially underlying the heavily doped region;

and an outer well ring of the second conductivity type formed about the perimeter of the deep well and the guard ring. The second well comprises an upper peripheral corner, wherein the outer well ring is positioned about the upper peripheral corner. Preferably, the first conductivity type is p-type and the second conductivity type is n-type.

An edge between the heavily doped region and a guard ring extends into the guard ring for about the full extend of the lateral doping variation of the heavily doped region. The heavily doped region extends about half way across the guard ring. The avalanche photodiode further comprises an anode comprising a ring formed about the edge of the heavily doped region, the anode ring being composed of combination of a heavily doped active region silicide and a stack of one or more metal vias and contacts. The avalanche photodiode further comprises a cathode comprising a ring formed about and attached to the outer well ring, the cathode ring being composed of combination of a heavily doped active region silicide and a stack of one or more metal vias and contacts. The avalanche photodiode further comprises bulk ring contacts formed in the substrate and extending substantially about the outer well.

The avalanche photodiode can be incorporated into a single-photon avalanche detector (SPAD) pixel which also includes a quenching element electrically connected to the anode; and a buffer electrically connected with the anode. The quenching element is one of a high-resistance polysilicon resistor, a thick oxide PMOS transistor, and a high-voltage, high-drain resistance PMOS transistor. The SPAD pixel can be connected to a transmitter circuit configured to transmit a single-photon pulse produced by the SPAD pixel so as to form a pixel for a sensor array.

The SPADs comprising the avalanche photodiodes described above can be incorporated into a sensor array comprising a plurality of pixel elements, each of the pixel elements being configured to operate on discrete value continuous time (DVCT) basis. Each of the pixel elements outputs a voltage corresponding to a logical high when light is detected and the logical high is held for a time proportional to the intensity of the light. Each of the pixel elements can be accompanied by a sensing and amplification circuit (D); a gain and offset non-uniformity correction circuit (NUC); and an event state tagging circuit (EST). Computational and data routing circuits comprise read the outputs of and control the plurality of pixel elements, and can include a peripheral processor (PP); asynchronous readout circuits for columns and rows (XAR, YAR, respectively); a global control circuit for asynchronous readout (GAR); and a global control circuit (GC).

BRIEF DESCRIPTION OF THE DRAWINGS

The present invention will be more readily understood from the detailed description of an exemplary embodiment presented below considered in conjunction with the attached drawings, of which.

It is to be understood that the attached drawings are for purposes of illustrating the concepts of the invention and may not be to scale.

DETAILED DESCRIPTION OF THE INVENTION

Disclosed herein is a design for building avalanche photodiodes that are free of edge effects at both the lateral and bottom sides of the junctions involved. Further described herein are pixel circuits incorporating such avalanche photodiodes which exhibit minimal dark counts that are manufactured using a low voltage, deep-submicron and nano CMOS foundry process. When the avalanche photodiodes are incorporated into an array of sensor array pixels, each of the pixels produces a digital output which can be used in an array readout such that the pixel size does not increase in size with the number of pixels in the array—signifying a big breakthrough in the design of large monolithic arrays of low-light level sensors. To achieve large arrays with high resolution (10000×10000 pixels), a small size pixel detector and a large transistor count in the pixel is needed to implement state holding and tagging elements such as counters and other processing circuits. This is made possible by the use of deep submicron and nano CMOS technologies. The pixel fill factor using such a design is double that which has been reported thus far. A further feature of the invention is that the pixel can also be operated in integrating mode in the presence of higher intensities of light.

Figure 1:
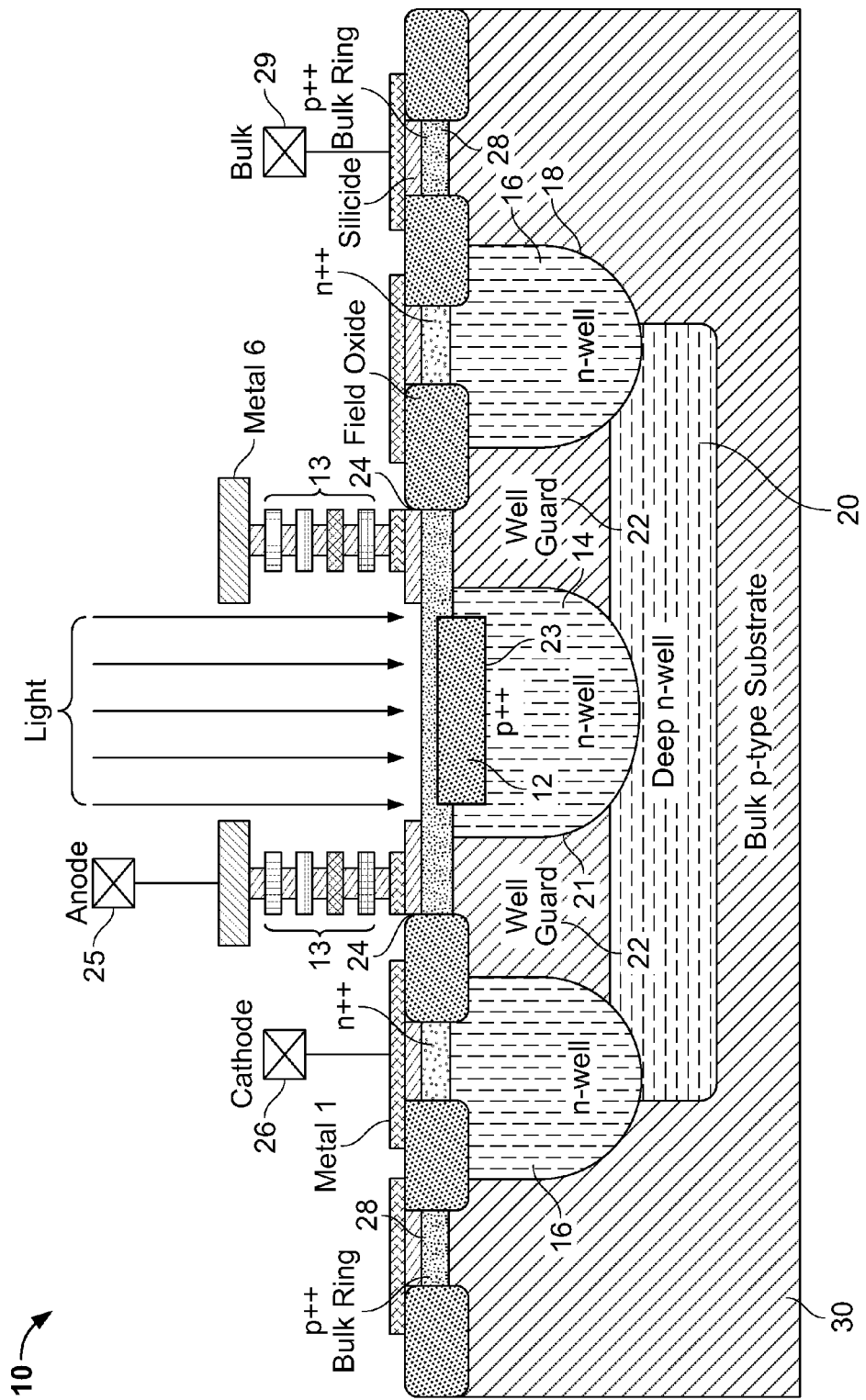
FIG. 1 is a cross section of a single photon avalanche photodiode, constructed in accordance with an embodiment of the present invention.
Figure 2:
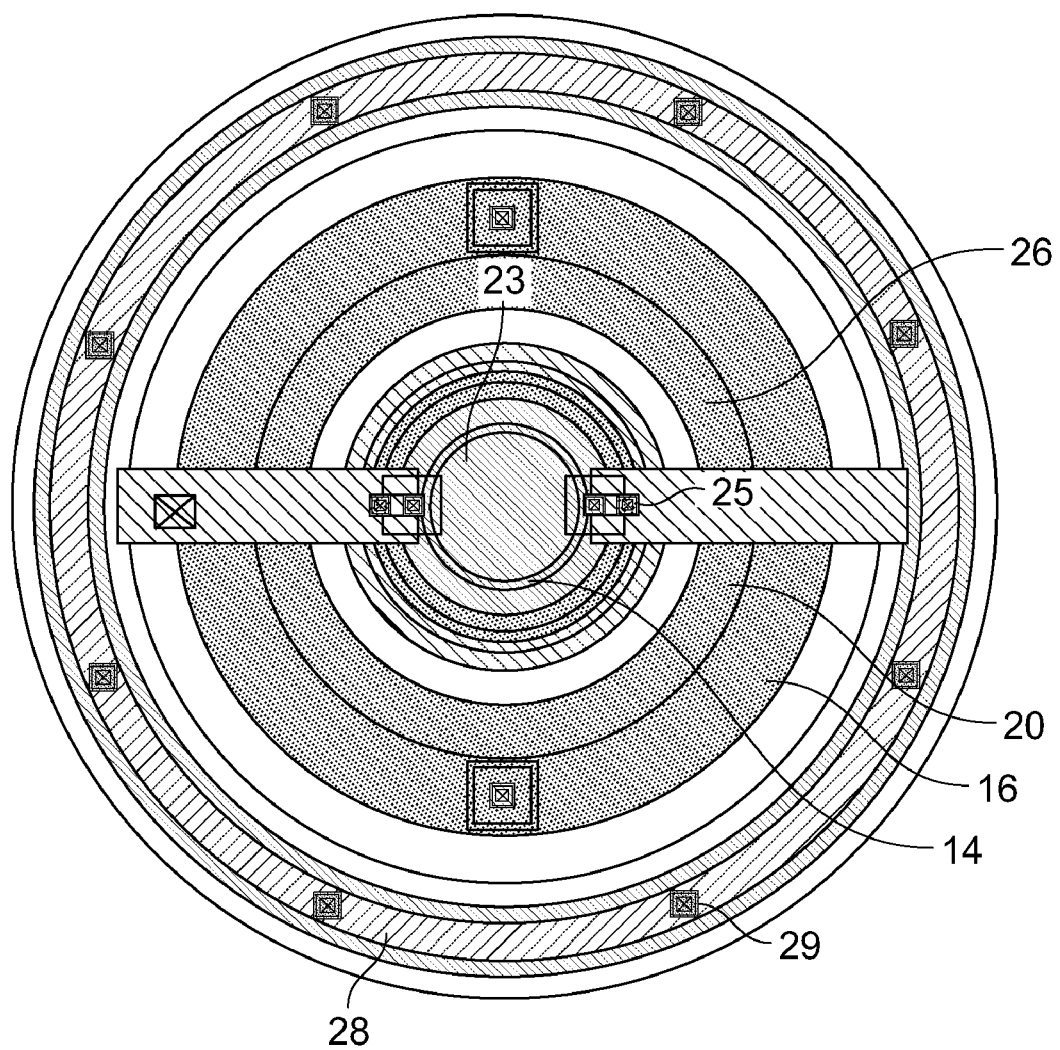
FIG. 2 is perspective view of the avalanche photodiode of FIG. 1.

FIG. 1 is a cross section of and FIG. 2 is a top-down view of a single photon avalanche photodiode 10 fabricated in a standard 1.8 V deep-submicron 0.18 um non-epitaxial CMOS process, respectively, constructed in accordance with an embodiment of the present invention. An epitaxial process can also be employed without changing the architecture of the device. The single photon avalanche photodiode can have a circular/cylindrical shape in the preferred embodiment, but other shapes and topologies are within the scope of the present invention. In the present embodiment, the single photon avalanche photodiode 10 includes a p++ region 12 substantially overlying a central n-well 14. The combination of this central n-well 14 and the p++ region 12 forms a photosensitive junction and avalanche multiplication region 23 in the center of the device 10. A deep n-well 20 formed through the process of buried ion implantation during fabrication substantially underlies the central n-well 14. Well guard regions 22 preferably made of a lightly doped p-type material (also found in the substrate 30), forms guard rings extending substantially about the periphery of a multiplication region 23 (in the central part of the photosensitive area) at least partially underlying the p++ region 12 and the central n-well 14 (thereby enclosing the edges 24 of the p++ region 12). In a preferred embodiment, the well guard regions 22 are designed so that they are larger than the deep n-well 20 by forming a ring of outer n-well 16 about the perimeter of the deep n-well 20 such that the outer n-well 16 extends both inside and outside the deep n-well 20. An anode 25 forms a ring about and overlying the edge 24 of the p++ region 12, which is made preferably but not limited to a combination of a heavily doped active region silicide and a stack of 13 of one or more metal vias and contacts. A cathode 26, made of a combination of a heavily doped active region silicide and a stack of one or more metal vias and contacts, form a ring about and are attached to the outer n-well 16 to provide electrical contact to the deep n-well region 20 that also provides electrical contact to the outer n-well 16. Bulk ring contacts 28 are formed in a p-type substrate 30 which extends substantially about the outer n-well 16 and the deep n-well 20. The bulk terminal 29 provides electrical contact for bulk ring contacts 28. Since all regions of the avalanche photodiode 10 are circular in the preferred embodiment, they are therefore substantially symmetrical, including the well guard ring 22 with bulk ring contacts 28 surrounding the central region of the device structure 10, which permits a constant electric potential region to be maintained in the avalanche region of the photodiode 23. Table 1 shows example design parameters of a 10 μm diameter avalanche photodiode constructed in accordance with the structure of FIGS. 1

TABLE 1

| Fabrication Layer | Inner Radius (μm) | Outer Radius (μm) |
|---|---|---|
| p++ (center) | 0 | 7 |
| deep n-well | 0 | 11 |
| n-well (center) | 0 | 5 |
| n-well (peripheral) | 9 | 13 |
| Photosensitive area (center) | 0 | 5 |
| Metal 1 | 11 | 13 |
| Metal 6 | 5 | 8 |

Figure 3A:
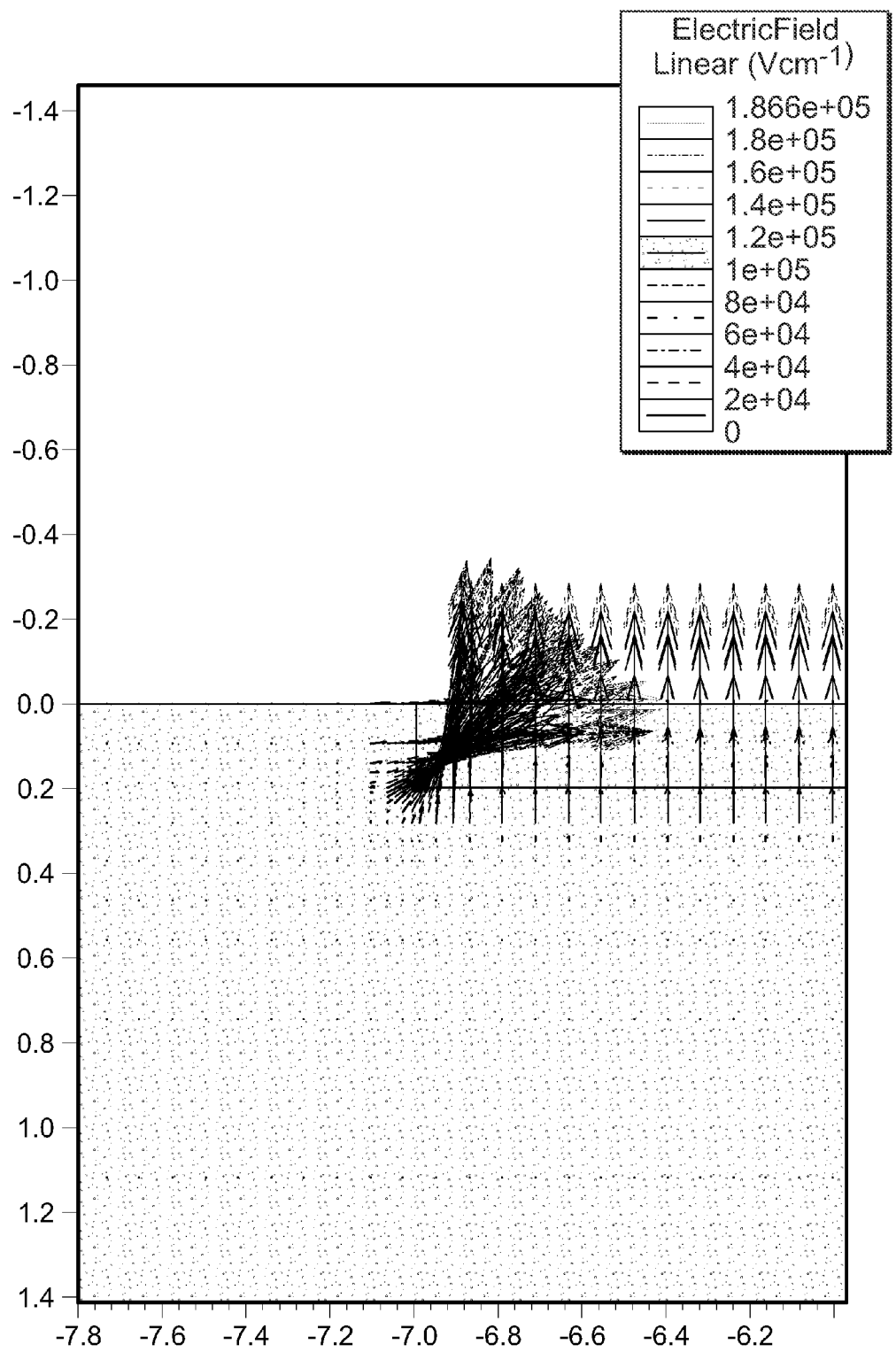
FIG. 3A is a plot of a doping profile in an equivalently doped avalanche photodiode that does not incorporate a guard ring in the prior art.
Figure 3B:
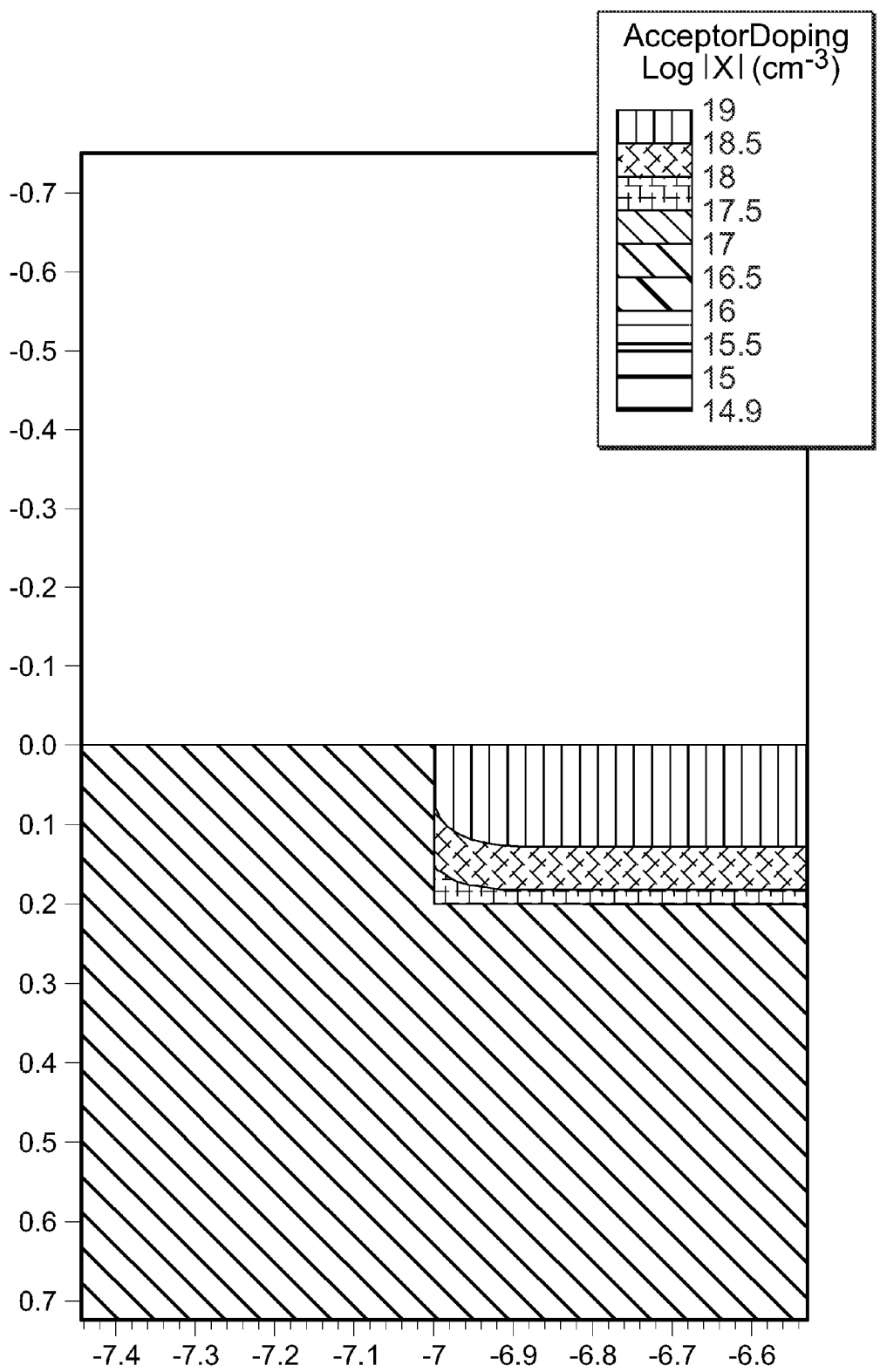
FIG. 3B is a plot of an electric field corresponding to the doping profile of FIG. 3A.

Referring now to FIGS. 1, 2, 3A and 3B, there is shown a doping profile and electric field in an equivalently doped avalanche photodiode that does not incorporate a properly designed guard ring, respectively. Referring now to FIG. 3A, the simulated lateral doping profile represents the typical tapering that occurs along the edge 24 of the p++ region 12 (The extent to which the doping at the edge 24 of the p++ region 12 has a lateral gradient depends on the fabrication process.). Referring now to FIG. 3B, simulation of the electric field shows that the maximum electric field occurs along the edge 24; therefore, the edge 24 possesses the lowest breakdown voltage and undesirable premature avalanche that can occur. When the well guard ring 22 made of lightly doped material of the type in p++ region 12 (in the present embodiment, being the lightly doped p-type substrate material) is incorporated in the avalanche photodiode 10, the edge 24 of the p++ region 12 is shielded from the outer n-well 16. The breakdown voltage of a p-substrate doped material (well-guard) 22 -to-n-well 23 junction will be orders of magnitude higher than the desired breakdown of the primary p++ 12 -to-n-well 14 junction. In order for the guard ring 22 to properly shield the edge 24 from premature breakdown, the p++ region 12 should be fabricated such that the edge 24 extends into the well guard region 22 enough to enclose the bottom and side of the active multiplication region 23 for the full extent of the lateral doping variation the p++ region 12, which is not perfectly squared off at the edges. By the same token, the p++ region 12 can not extend so far as to present a problematic junction with the outer n-well region 16 on the other side of the well guard ring 22 (between the well guard ring 22 and the outer n-well region 16), and so should extend about halfway across the well guard ring 22. Computational simulations were performed to determine the exact extend and width of the various regions.

Figure 4A:
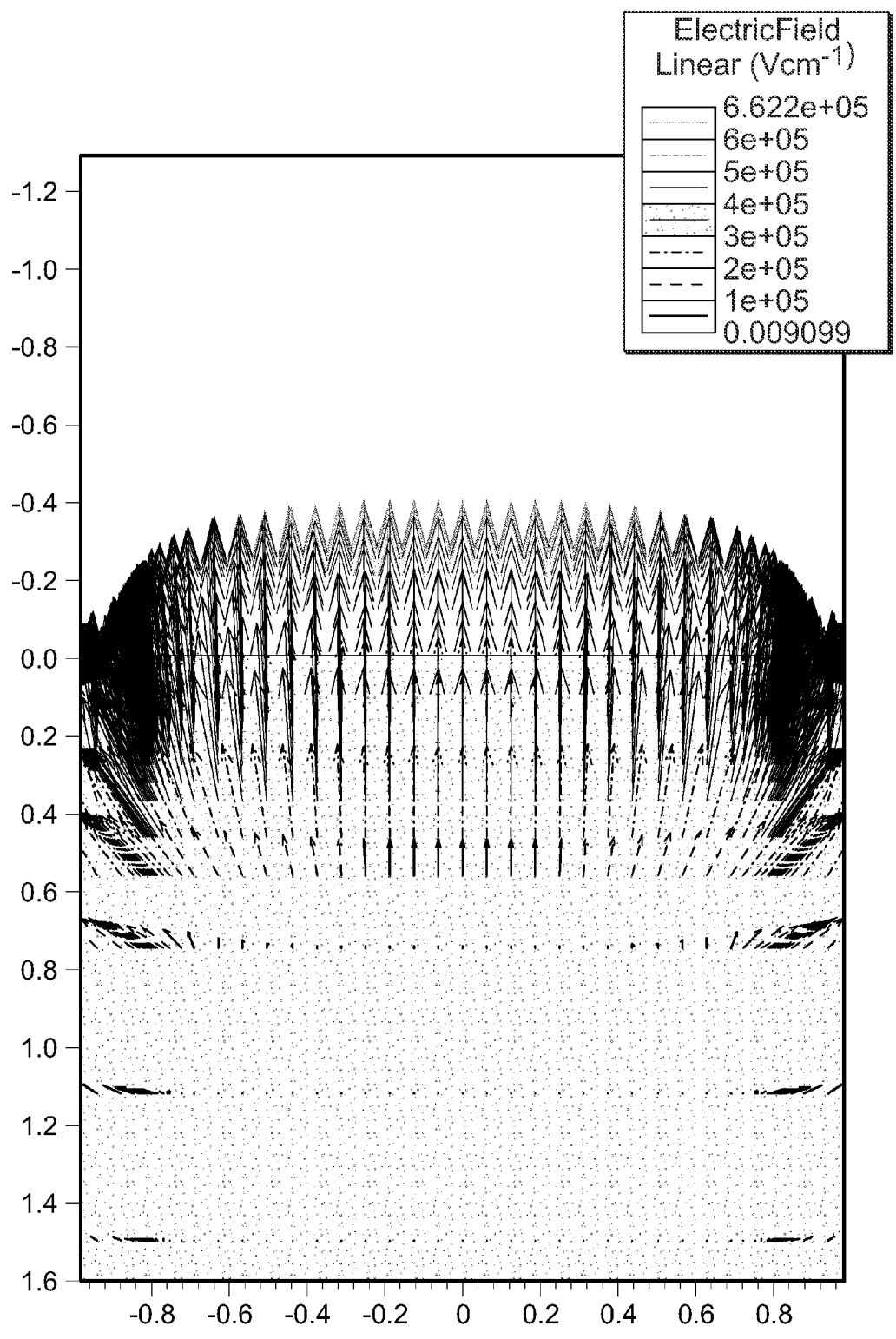
FIG. 4A is a plot of an electric field in an avalanche photodiode with the minimum sized active region.
Figure 4B:
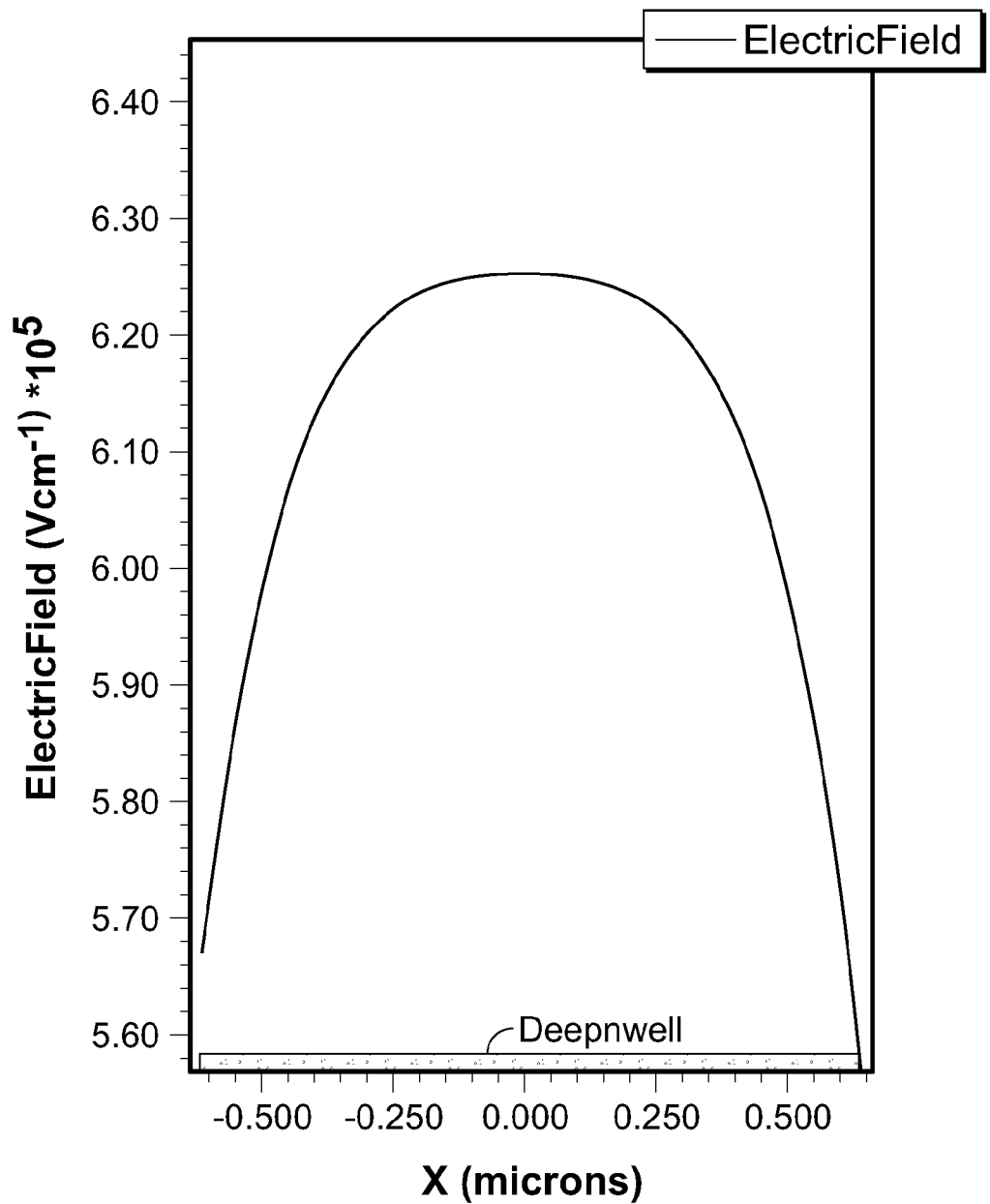
FIG. 4B is a plot of the doping profile corresponding to the device of FIG. 4A.
Figure 5A:
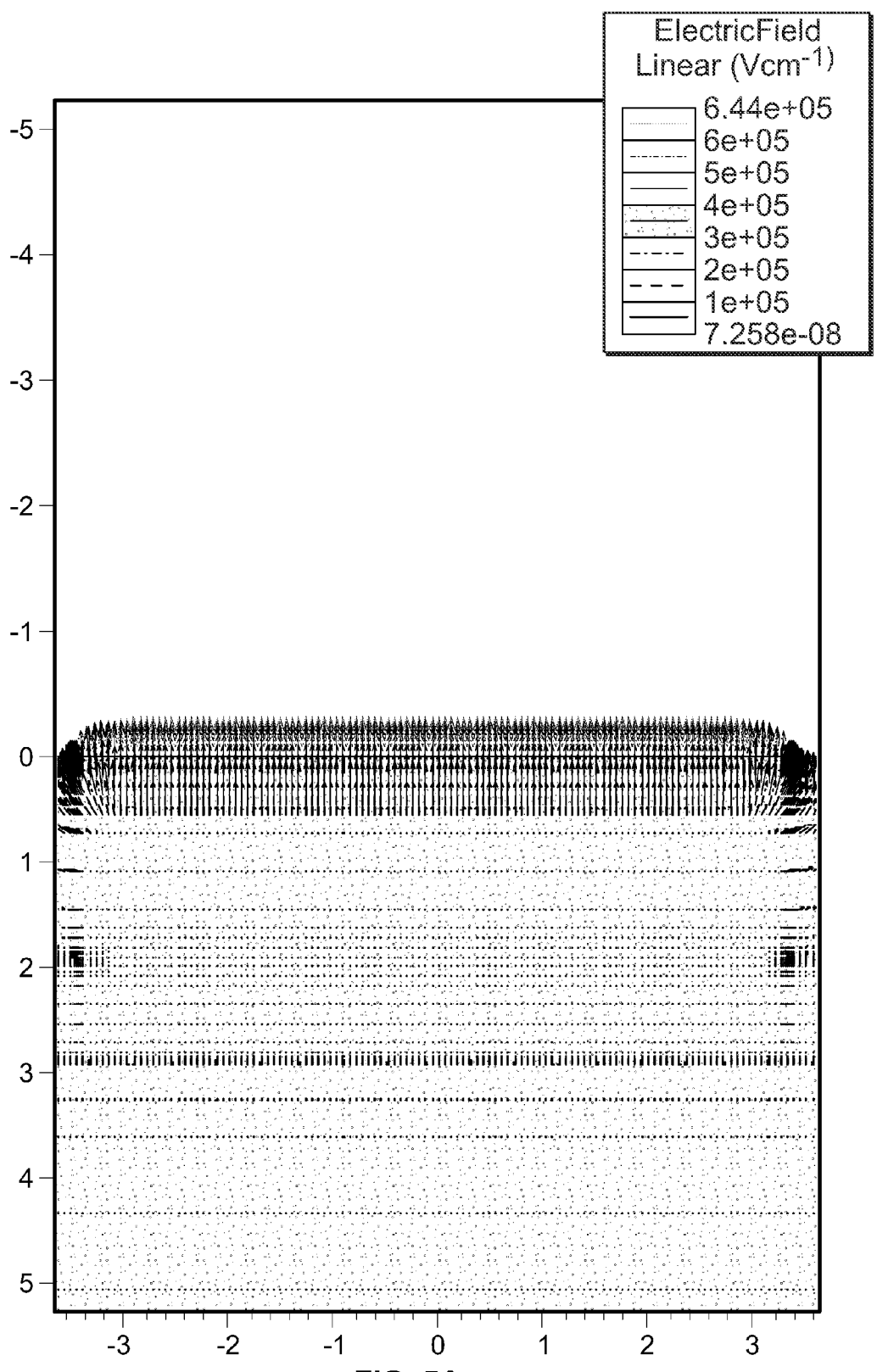
FIG. 5A plot of an electric field in an avalanche photodiode with wider optimized active region.
Figure 5B:
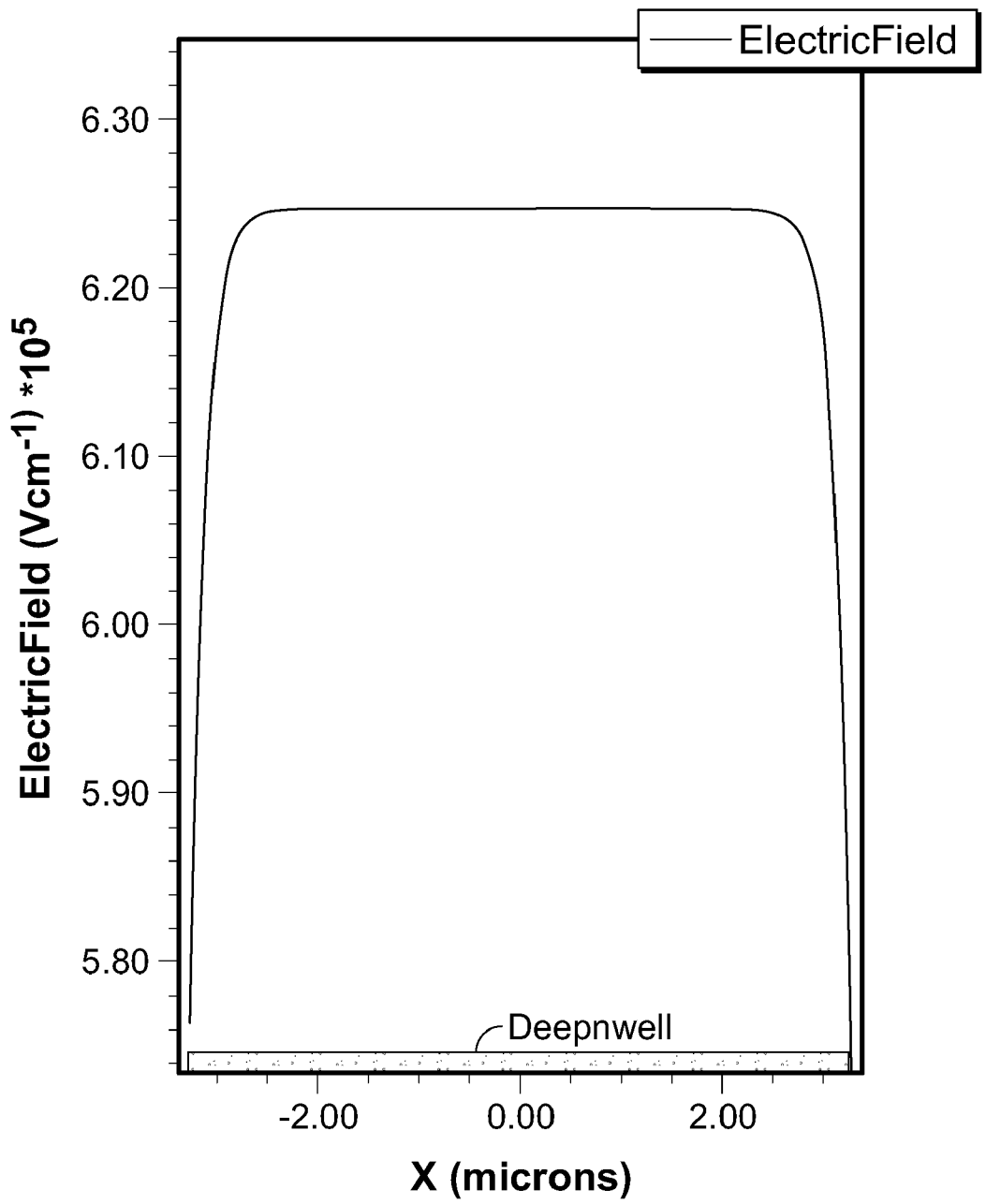
FIG. 5B is a plot of the doping profile corresponding to the device of FIG. 5A.

The active, multiplication region 23 can be defined as the abutment of the p++ region 12 with the inner n-well 14 for the full extent of the region between the well guard ring 22. When fabricated, the well guard ring 22 is not abruptly defined, as evidenced by the layout design rules which are conservative even for processes with very small feature sizes; furthermore, the well guard ring 22 can form a depletion region along the border 21 with the n-well region 14. This results in an electric field profile in a minimum-sized device which does not exhibit the catastrophic edge effects described above, but also does not manifest a maximum, uniform electric field for all the stretch of the photosensitive p++ region 12. FIGS. 4A and 4B illustrate the electric field in a device with the minimum sized active region, while FIGS. 5A and 5B show the electric field for a device with well guard ring properly spaced to correct for this phenomenon and achieve uniform electric field distribution over the whole photosensitive active multiplication area of the p++ region 12.

Another important aspect of the design of the avalanche photodiode 10 is the careful preservation of the symmetry inside the avalanche photodiode 10 and the even distribution of electric potential from input bias. To achieve this, a circular mask layout for every region of the avalanche photodiode 10 is maintained. Even the bulk ring contacts 28 at the periphery of the avalanche photodiode 10 are arranged inside the continuous well guard ring 22 which includes a p++ doped region 18 in the p-type substrate 30 with ohmic contacts evenly spaced throughout as shown in FIG. 2. Another factor in the design process arises due to the CMOS technology used being a silicided one; therefore, a silicide-blocking RPO mask layer is included during the design process over the active multiplication region 23 to maintain a transparent path for incoming photons and improve the photosensitivity of the device. Lastly, the large negative bias (relative to CMOS circuits on the chip) required for the anode 25 of the avalanche photodiode 10 can be routed using the uppermost metal layer available (metal 6 in this case) to keep the voltage as far as possible from the underlying structures in the photodiode 10. A stack of vias and contacts 13 are employed to accomplish this. In the present embodiment, a stack of five vias is employed.

Figure 6:
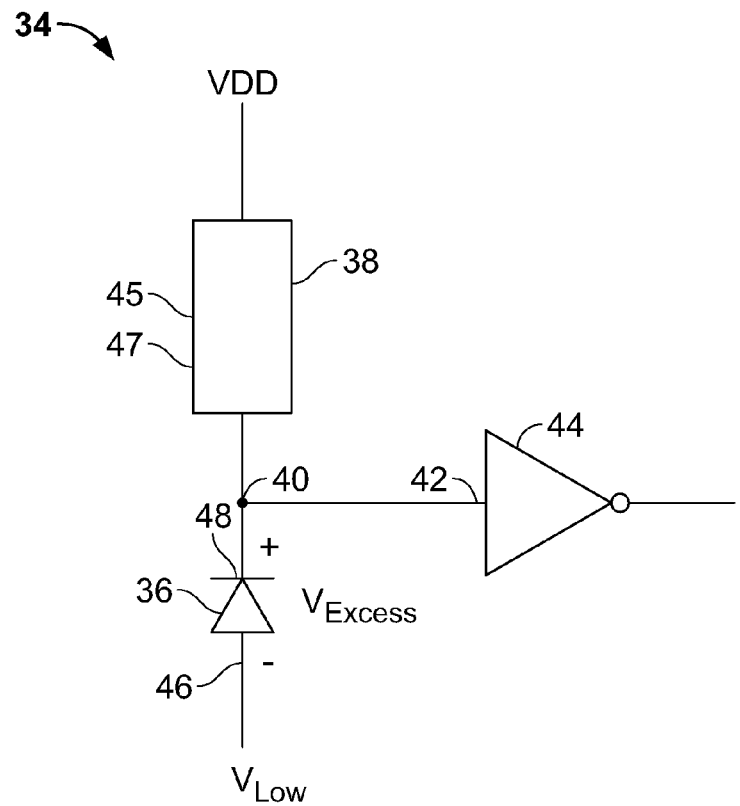
FIG. 6 is an idealized schematic diagram of a single photon avalanche detector (SPAD) pixel constructed in accordance with the avalanche photodiode of FIG. 1.

When an avalanche photodiode is biased in Geiger mode, any incident photon causes an avalanche of impact ionization in which electron-hole pairs are generated at a rate that exceeds the rate at which the electron-hole pairs can be collected by an external circuit. In order to quench potential runaway current in the avalanche photodiode and create a single photon avalanche detector (SPAD), some form of quenching element can be used to reset the avalanche photodiode after a photon is detected. FIG. 6 shows an idealized SPAD 34 which includes a single photon avalanche photodiode 36 connected in series with an adaptive quenching element 38. The quenching element 38 includes input terminal 45 that can be used for adaptive control of the quenching process. The output 40 between the photodiode 36 and the quenching element 38 is fed into the input 42 of an inverter/buffer 44. The quenching element 38 is used to limit the current to prevent damage to the single photon avalanche photodiode 36 to reset the photodiode 36 when used as a SPAD, putting the diode in a state for detection of subsequent photons. The quenching circuit has an input control 45 to adapt the properties of the quenching circuit and optimize its functionality (e.g., for non-uniformity correction to accommodate individual device mismatch in an array). The input 45 to the quenching circuit 38 can be either digital or analog. An additional input 47 is also provided to the actual physical structure of the SPAD that can adapt the behavior of the device to optimize its functionality.

Specifically, in the technique used in the present invention, the anode 46 of the photodiode 36 is set to a voltage $V_{low}$. The quenching element 38 is connected between the supply voltage $V_{high}$ and the cathode 48 of the device. $V_{low}$ is selected (once the breakdown voltage of the device is properly characterized) to satisfy the requirement that when $V_{low}$ is added to the $V_{high}$ voltage, the avalanche photodiode 36 is biased at some voltage $V_{excess}$ above its breakdown voltage. In the configuration shown in FIG. 6, when an incident photon is detected, a large avalanche current drops a voltage across the quenching element 38. When the voltage reaches $V_{excess}$, the photodiode 36 is no longer above breakdown and the avalanche is quenched. At the same time, the drop in the quenching element's voltage can be detected by feeding it into the input 42 of the inverter/buffer 44.

The quenching element 38 can be (a) a high-resistance-polysilicon resistor or (b) a thick oxide PMOS transistor or (c) a high-voltage, high-drain resistance PMOS transistor that can tolerate voltages swings greater even than the avalanche photodiode anode bias. In the past, the quenching device used for silicon SPADs has been either an actual resistor or a PMOS device acting as one. Both of these are compatible with the photodiode 36 described in the present invention.

Figure 7:
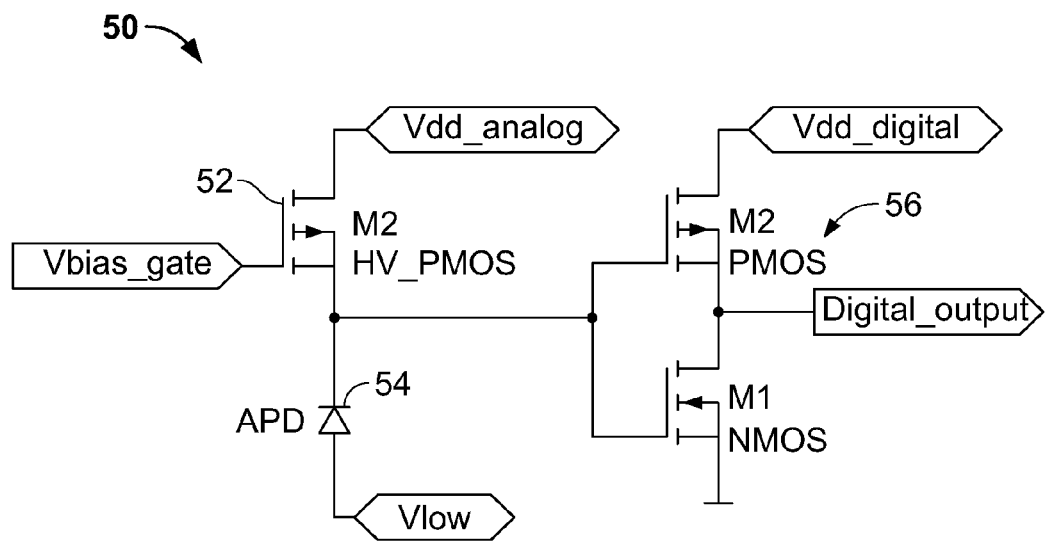
FIG. 7 is an electrical schematic diagram of an actual SPAD pixel constructed in accordance with an embodiment of the present invention.
Figure 8:
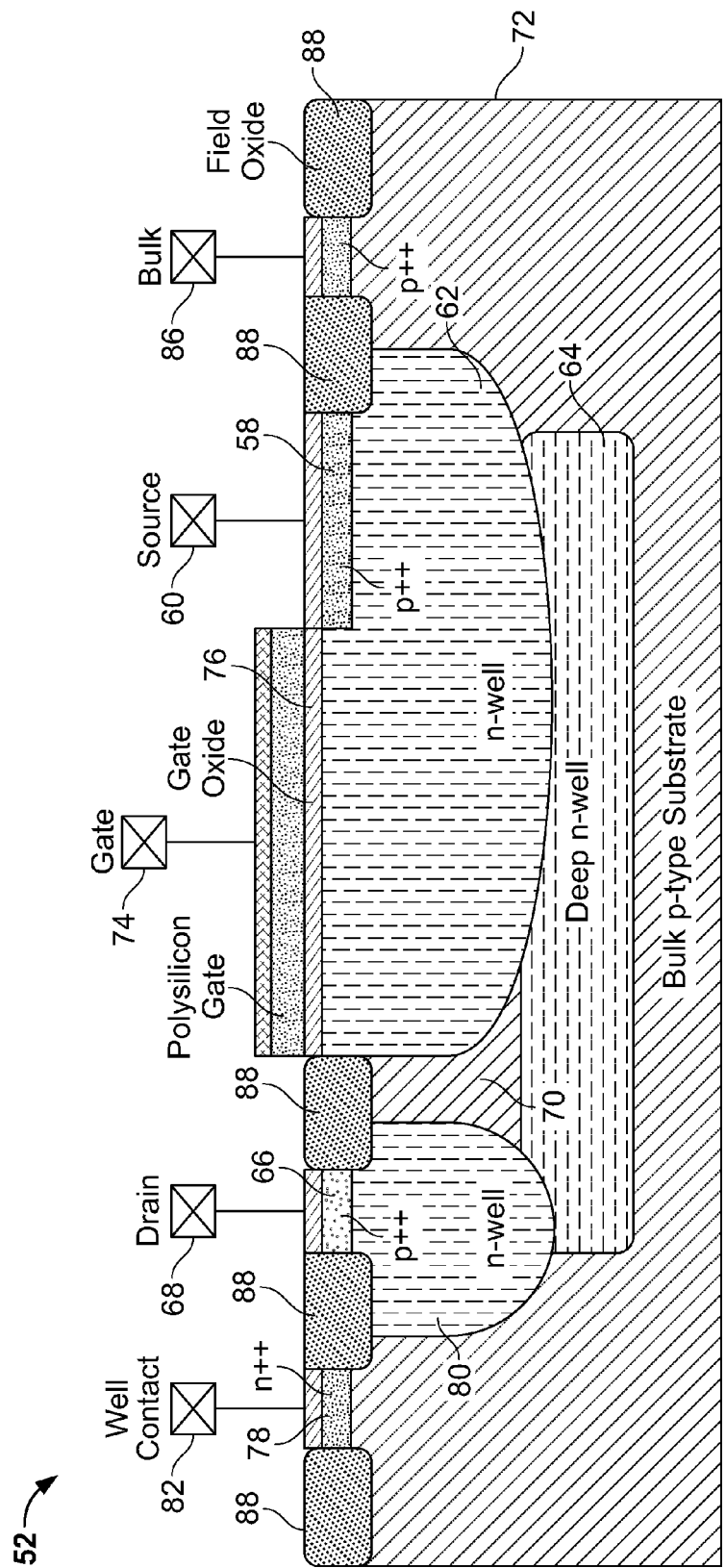
FIG. 8 is a cross sectional diagram of an HVPMOS transistor employed in the SPAD of FIG. 7.

FIG. 7 shows an electrical schematic diagram of a SPAD interface circuit 50 constructed in accordance with an embodiment of the present invention. A thick-oxide, high voltage PMOS transistor 52 is used to quench a single photon avalanche photodiode 54 in place of a resistor. A digital CMOS output buffer 56 is integrated into the SPAD 50 to read out the voltage pulses measured across the quenching high voltage PMOS transistor 52 when the high voltage PMOS transistor 52 is biased above breakdown. In one embodiment of the SPAD 50, a high-resistance polysilicon layer (not shown) can be used in place of the high voltage PMOS transistor 52 to create an integrated quenching resistor, while a thick-oxide PMOS transistor can be used in a second embodiment. The second embodiment is more attractive because it potentially has less capacitance and occupies less area. On the other hand, in a low-voltage process such as TSMC (Taiwan Semiconductor Manufacturing Corporation) 0.18 μm, the voltage tolerance of the photodiodes 54 puts a limit on the amount of excess voltage $V_{excess}$ that can be applied to a photodiode 54. The available photodiodes in the prior art have limits of 1.8V for a standard device and 3.3V for the thick-oxide transistor, while the breakdown voltage of avalanche photodiodes of the present invention is approximately 10V and a further overvoltage is necessary to bias the photodiode 54 in the Geiger-mode region of operation; therefore, a transistor that can weather a drain-source voltage as high as the total applied bias is needed to ensure reliability and safe operation of the SPAD 50. To solve this problem, a HVPMOS transistor 52 can be employed in a preferred embodiment FIG. 8 is a cross sectional diagram of the HVPMOS transistor 52 employed in the preferred embodiment. The HVPMOS transistor 52 includes a p++ region 58 comprising the source 60 of the transistor 52 which at least partially overlies and extends into an n-well 62. The n-well 62 at least partially overlies a deep n-well 64. A p++ region 66 forms the drain 68 overlying a bulk p-type region 70 similar in composition to the bulk p-type substrate 72 to allow for a larger overvoltage across an avalanche photodiode than the standard high-voltage 3.3V device offered in a TSMC process and other deep submicron and nano CMOS processes. A gate electrode 74, preferably made of polysilicon, overlies the n-well 62 with a gate-oxide layer 76 intervening there between. An n++ junction 78 is formed inside a second n-well 80. A well contact 82 is affixed to the n++ junction 78. The n++ junction 78 at least partially overlies the deep n-well 64. A p++ region 84 is formed overlying the substrate 72 and is affixed to a bulk contact 86. Field oxide layers 88 fill in the gaps between the n++ junction 78, the p++ region 66, the p++ region 58 and the p++ region 84, all of which at least partially overlie bulk p-type region 70 or the substrate 72. The n-well 80, the n-well 62, and the deep n-well 64 also at least partially overlie the substrate 72.

Figure 9:
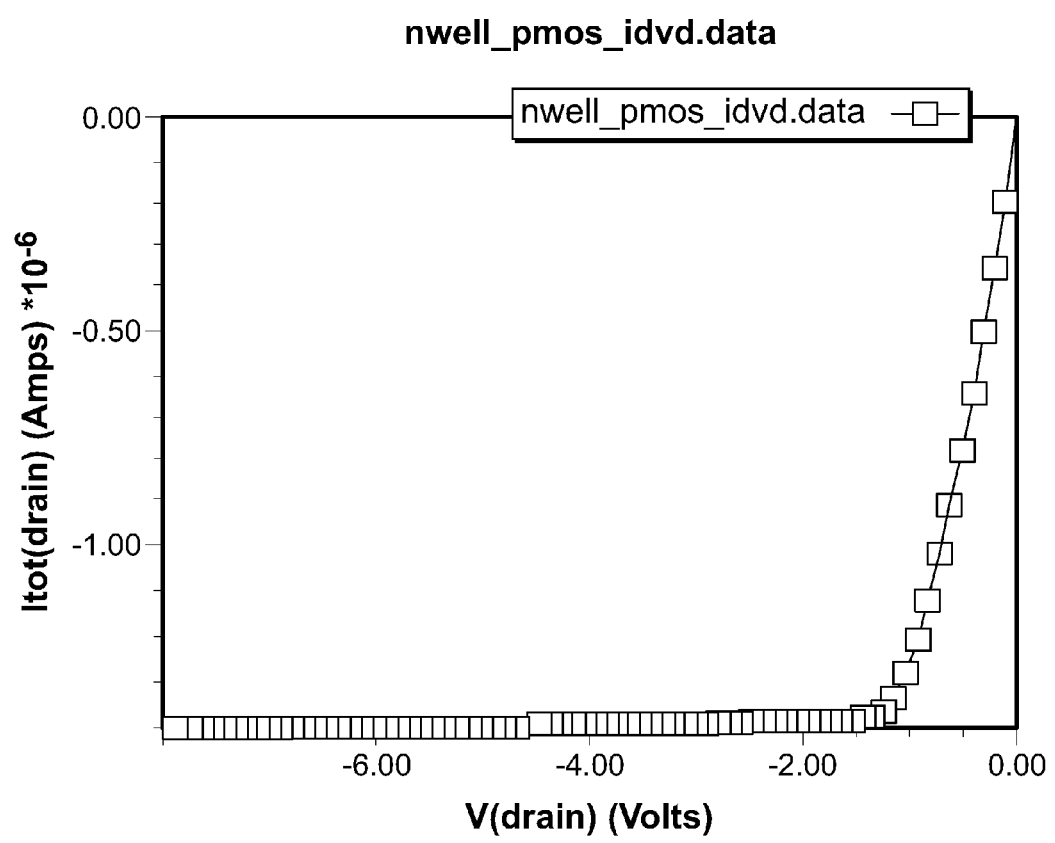
FIG. 9 is a simulated characteristic of the HVPMOS transistor of FIG. 8.

The maximum gate voltage that can be applied with respect to the source 60 is dominated by the breakdown of the gate oxide layer 76 just like in a typical PMOS transistor. The maximum drain voltage, on the other hand, is greatly enhanced by its having a significantly lower doping in the drain region p++ region 66, which increases the breakdown voltage between the deep n-well channel 64 and the drain 68. The lower doping also provides the added benefit of significantly increasing the resistance of the drain 68, which translates into a more efficient quenching device that can generate a pulse and reset the detector when presented with a smaller avalanche current. The I-V characteristic of the device, derived from a simulation of the device performed using a device simulator is shown in FIG. 9.

Figure 10:
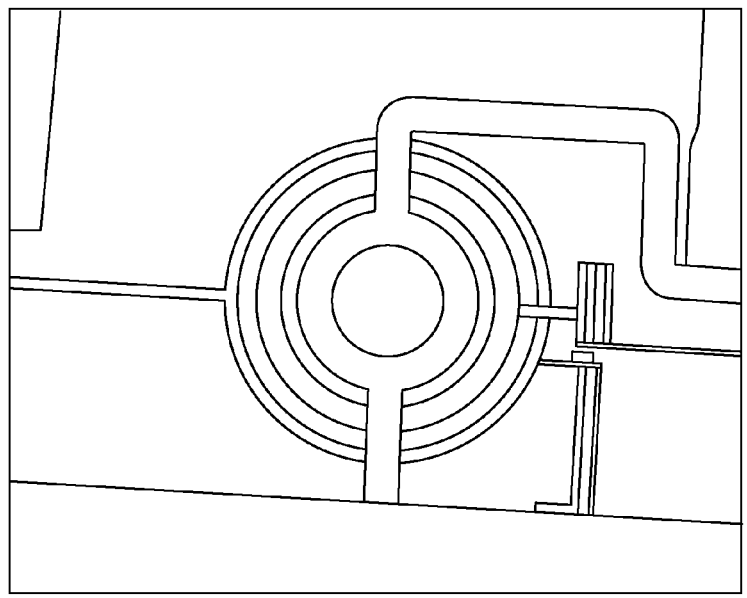
FIG. 10 is a photograph of a SPAD fabricated in accordance with an embodiment of the present invention.

Referring again to FIG. 7, the diameter of the active area of the photodiode 54 is about 10 μm, while the overall diameter of the SPAD 50 is 26 μm. This translates into a fill factor of up to 15% for the detector, which is roughly double that of any reported thus far. A photograph of an actual fabricated SPAD is shown in FIG. 10.

The circuit of FIG. 7 outputs a pulse for every incident photon when the avalanche photodiode 54 is biased above its breakdown voltage. At the heart of the avalanche photodiode 54 is a p-n junction that can also be used to detect greater light intensities without saturating by operating it at reverse biases comparable to avalanche photodiodes employed in active pixel sensors. In context of the SPAD 50 of FIG. 7, when the photodiode 54 is biased at low voltage, it exhibits a gain of one. The intensity of light incident on the SPAD 50 can be measured in this mode by using the PMOS gate bias as a reset node, and measuring the time required to charge the digital inverter 56 to exceed its threshold voltage, at which point the SPAD 50 outputs a logic "1". This time interval is proportional to the photocurrent in the avalanche photodiode 54. A continuum of modes of SPAD operation also exists between a unity-gain SPAD and a Geiger-mode SPAD in the sense that for a wide range of biases below the breakdown voltage, the photodiode has a linear avalanche gain that allows it to be adjusted to a desired sensitivity according to requirements of illumination. Adaptive biasing and switching of the various voltages to accomplish the desired operation can be accomplished using digital switching circuits in the pixel and can yield a pixel that has essentially an infinite dynamic range.

A quenching circuit is used to both limit the current to prevent damage to the avalanche photodiode 54 and reset the SPAD 50, putting it in a state for detection of subsequent photons. When a standard CMOS process is used to fabricate the photodiodes 54, both quenching circuitry and timing electronics can be integrated with the photodiodes 54, yielding a compact, high-density monolithic array of single photon detector pixels. Deep submicron CMOS technology enables a far smaller single-photon detector pixel than those that have been implemented in the past. The implementation of a large monolithic array of detectors gives rise to the question of how to manage the throughput of the asynchronous pulses from each pixel.

Figure 11:
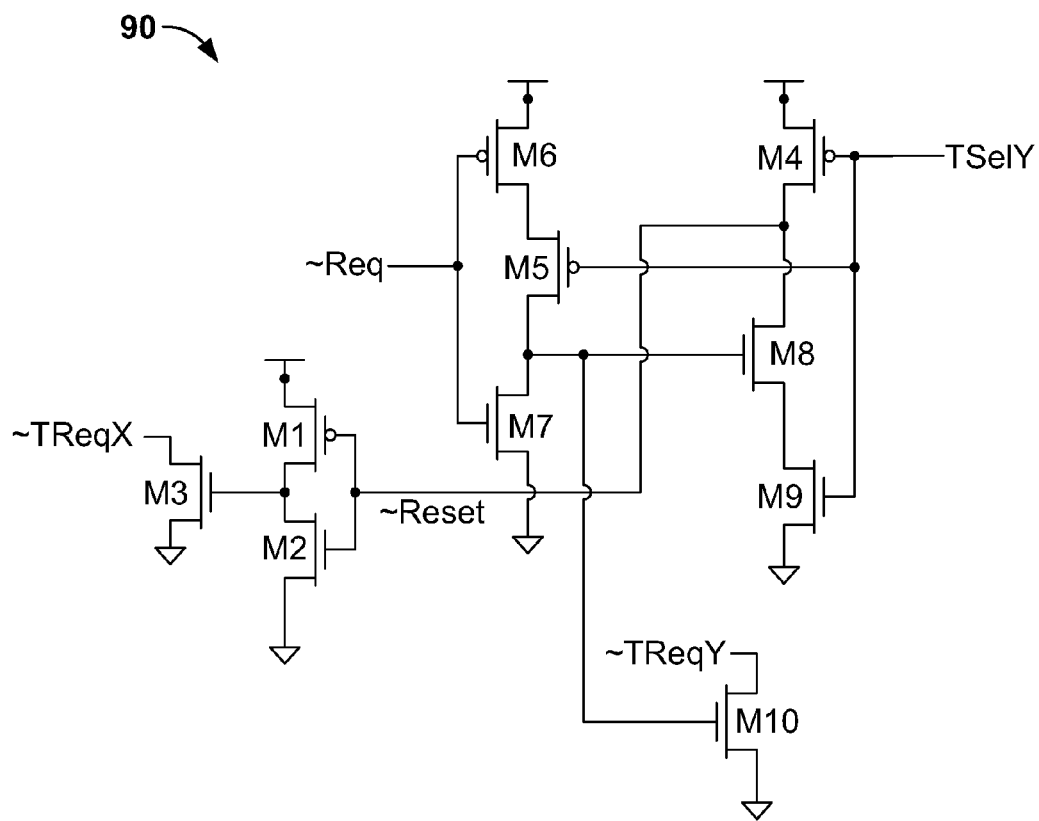
FIG. 11 is an electrical schematic diagram of an Address-Event Representation (AER) array readout circuit which is incorporated with a SPAD of FIG. 7 into a pixel as the interface circuitry required in each pixel to transmit an output pulse.
Figure 12:
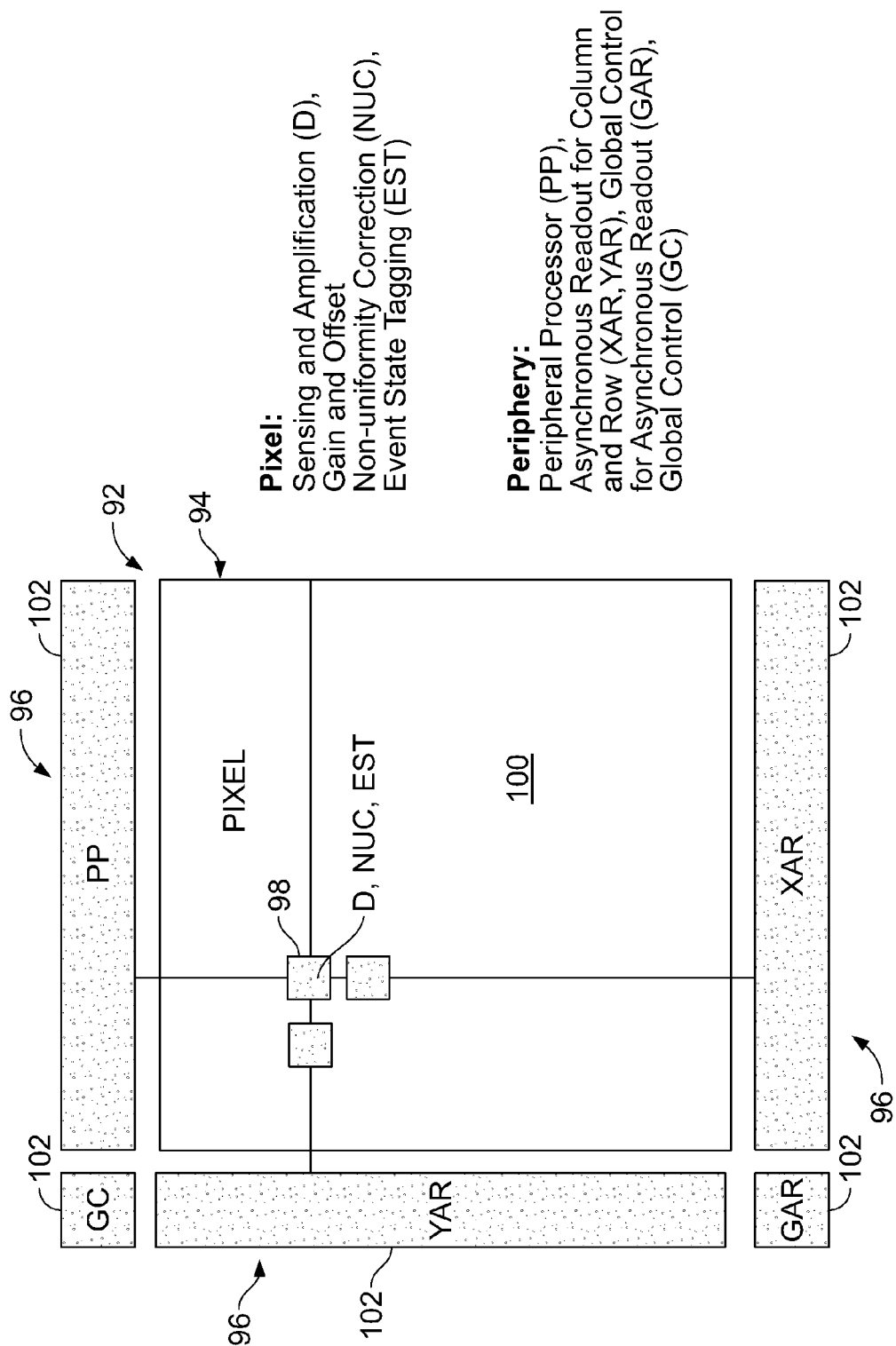
FIG. 12 shows a system architecture for an sensor array that includes, pixels, that incorporate sensing and amplification (D), non-uniformity correction (NUC) and event state tagging (EST) as well as peripheral processor (PP), array readout (XAR and YAR), global control for array readout (GAR) and global control (GC), according to an embodiment of the present invention.

FIG. 11 is an electrical schematic diagram of a pixel interface circuit 90 for the event based readout which is incorporated with a SPAD into a pixel as the interface circuitry required in each pixel to transmit an output events to the periphery of a large array (see FIG. 12). The pixel interface circuit 90 includes a transmitter circuit of fixed size in every pixel, and keeps the pixel size constant regardless of the size of the array. The pixel interface circuit 90 is configured to transmit a single-photon pulse produced by a SPAD. The digital pulse produced by the circuit of FIG. 7 is then transmitted through in which the address of the sending pixel is communicated through an asynchronous request and acknowledgment cycle.

Figure 13:
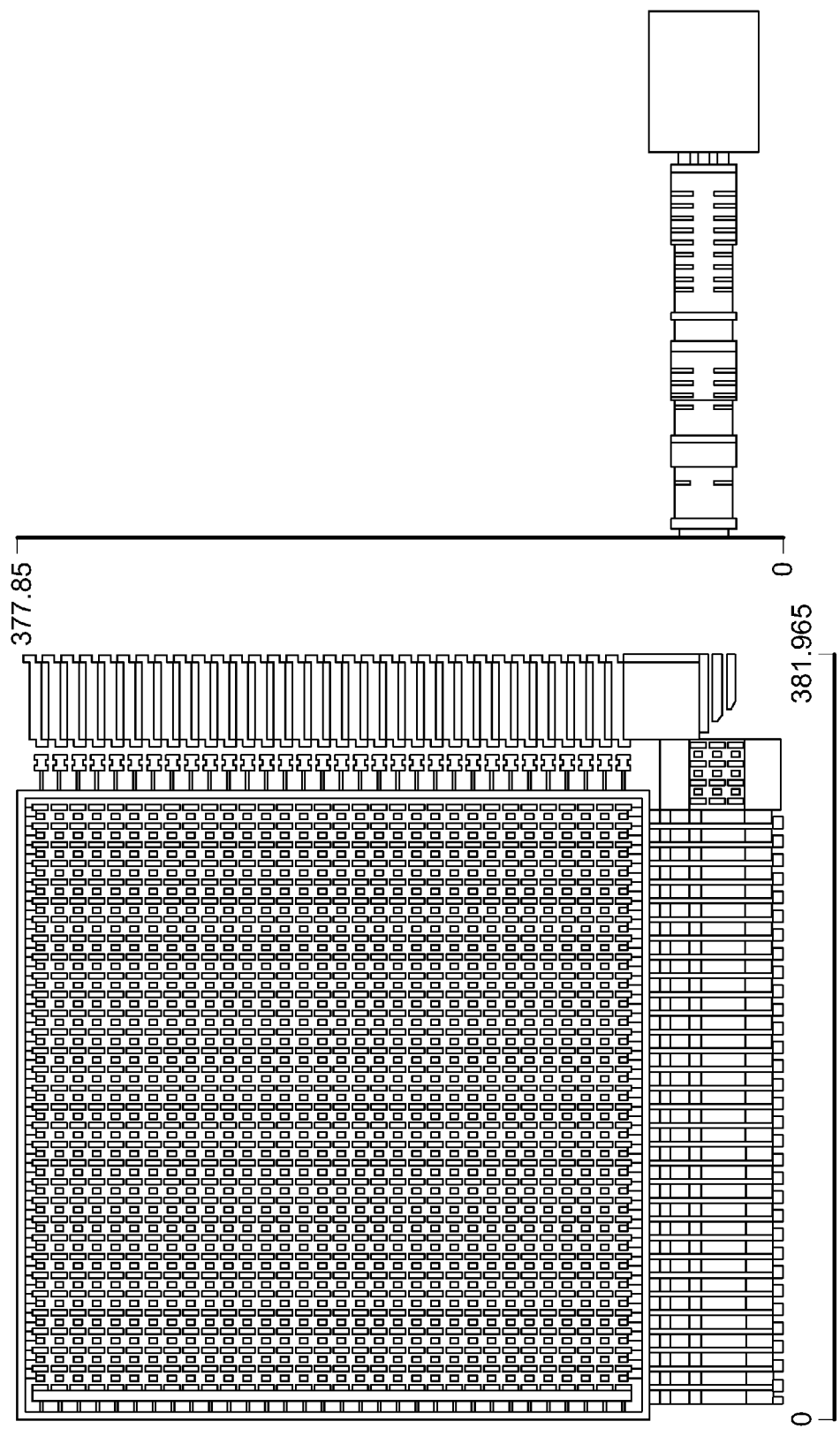
FIG. 13 shows a typical layout of the array and array readout and control as captured from the screen of a CMOS integrated circuit design program.

FIG. 12 is a block diagram of the architecture of a pixel array 92 which employs the SPADs of the present invention. FIG. 13 shows an image capture for a two dimensional array of pixels 94 and readout interface circuits 96 corresponding to FIG. 12. The pixel array 92 comprises pixel elements 98 which themselves comprise SPADs (not shown) and interface and processing elements 100 and four computational and data routing areas 102 in the periphery of the pixel elements 98. The interface and processing elements 100 at the pixel level include sensing and amplification circuit (D), gain and offset non-uniformity correction circuit (NUC), and an event stage tagging circuit (EST). The peripheral circuits 102 include a peripheral processor (PP), asynchronous readout circuits for columns and rows (XAR, YAR, respectively), a global control circuit for asynchronous readout (GAR), and a global control circuit (GC).

The pixel array 92 is not scanned to see if any events occurred in any one pixel 94; rather, the pixel 94 itself notifies the array's readout circuitry (XAR, YAR and GAR of FIG. 12) that a photon detection event occurred, and the pixel array 92 in turn acknowledges the receipt of the event information so that the pixel 94 can reset itself to wait for another event. A crucial feature of this implementation of the array readout circuits (XAR, YAR and GAR of FIG. 12) is the fixed size of the in-pixel circuitry, which is fully independent of the number of pixels in an array 92. This, along with the small size of the SPAD and the individual transistors in deep submicron CMOS, overcomes the obstacles in the design of large arrays of low-light-level optical sensors.

Figure 14:
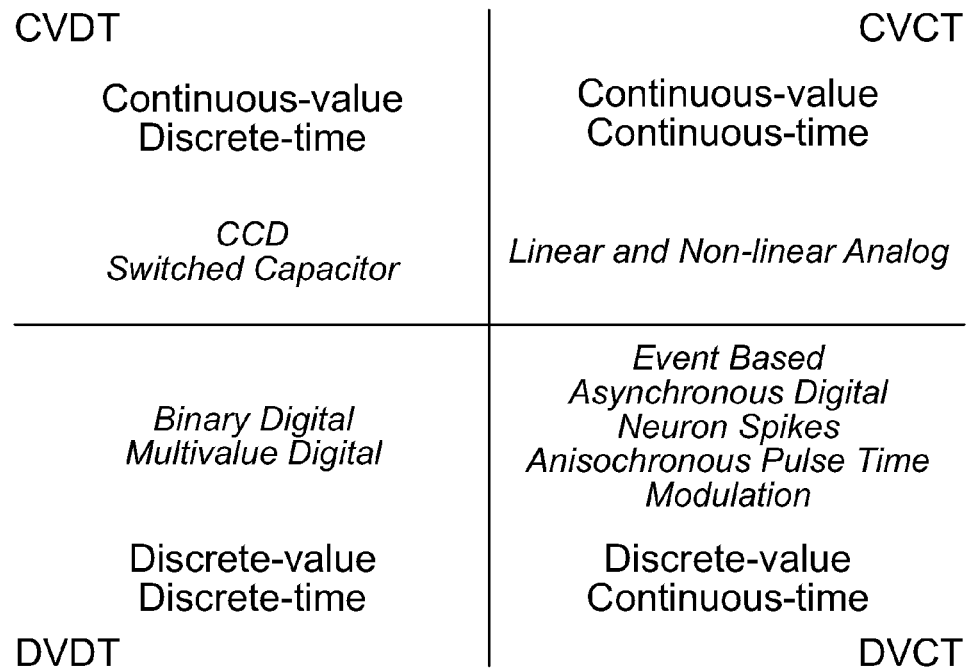
FIG. 14 shows the different kinds of signals that one can use to process information on a CMOS chip.

All peripheral circuits 102 are digital while at the pixel level, DVCT (discrete value continuous time) event based CMOS circuits are employed. Event based circuits are neither analog or digital but encode information in the timing between digital events and is similar to the way neurons encode information in the nervous system (See FIG. 14, wherein the types of curcuits in the "universe" can be divided into Continuous-Value Discrete-Time circuits (CVDT), such as a CCD Switched capacitor; Continuous-Value Continuous-Time circuits (CVCT), such as linear and non-linear analog circuits; Discrete-Value Discrete-Time circuts, such as binary digital and multivalue digital circuits; and Discrete-Value Continuous-Time circuits, such as event based asynchronous digital neuron spikes and Anisochronous Pulse Time Modulation). Two linear arrays of digital circuits at the periphery (YAR and XAR) are responsible for implementing both an event-based read-out scheme, whereby only a select number of pixels that have given intensity and or temporal characteristics are read out, and also a random-access readout scheme for manually selecting arbitrary regions-of-interest or sub-sampling in space or time.

The interface and processing elements 100 incorporate additional Discrete Value Discrete Time (DUCT) and Discrete Value Continuous Time (DVDT) circuits (see FIG. 14) to accomplish various tasks including non-uniformity correction (NUC) and event state tagging (EST). Event state tagging (EST) can be accomplished through a digital counter. Another embodiment of the event state tagging (EST) is that of a random number generator that involves a linear feedback shift register (LFSR) circuit whose state in incremented after each event arrives from a pixel element 98. The LFSR embodiment occupies less area than a digital counter based event state tagging circuit.

A computational circuit (PP) in the periphery of the pixel elements 98 performs computation that relate to the pixels 94 in the array 92, which is a crucial parameter for selective read-out. The block (GC) handle global control and interfacing functions and handshaking while the block (GAR) handles the interface control to the array readout. To minimize the communication bandwidth from the pixel array 92, additional digital computational circuits in the periphery are employed to achieve various functions such as intensity mean computation, pixel thresholding, and global event state tagging.

As an example of periphery processing, each column has an intensity mean column accumulator in the PP block and a global accumulator resides in the corner of the array (GC), as shown in FIG. 12. When a row is selected, the contents of the individual pixel counts are added to their corresponding column accumulator. Similarly, when a column is selected, the contents of the individual column accumulators are added to the contents of the global accumulator. The column accumulator array comprises of [$\log_2(M)$+K] bits and global accumulator is just [$\log_2(M)$+$\log_2(N)$+K] bits where N and M are the number of columns and rows in the pixel array respectively, and K is the number of bits representing the pixel intensity. Computation of the global intensity is therefore performed in a time proportional to [M+N], rather than [M×N] as is the case in conventional designs. Intensity normalization, i.e., the division of the accumulated value by the number of pixels in the array is performed internally or externally to the chip.

Pixel Thresholding: It is desirable to have the readout function of the array output a pixel intensity only when the intensity falls between two predefined values. An intensity comparison is necessary to know if the pixel intensity count (IC) is larger than a low threshold count (LTC) and smaller than a high threshold count (HTC). Therefore, in addition to the accumulators described in the previous section, the column of each array incorporates two magnitude comparators. When a row is selected, every intensity in the row is compared to the LTC and HTC values. An extra single bit register in each row is a flag that is set or reset to indicate at least one valid pixel exists in the row. This flag enables the auto-readout feature of the array. Note that the array is read out during the intensity mean computation as well. When the auto-readout feature is enabled, the pixels are read out using a priority encoder with fixed priority (lower left corner first, lowest row first). The priority encoder is designed as tree structure of OR gates to improve its speed.

Non-Uniformity Correction: (NUC) Compensating for mismatch in detector characteristics and in the sensor interface circuit characteristics necessitates a computational memory element at the pixel level. In the present invention, this is done as part of a system that tags the state i.e., the counter that incorporates memory and an arithmetic logic unit to perform the offset and gain compensation.

Figure 15:
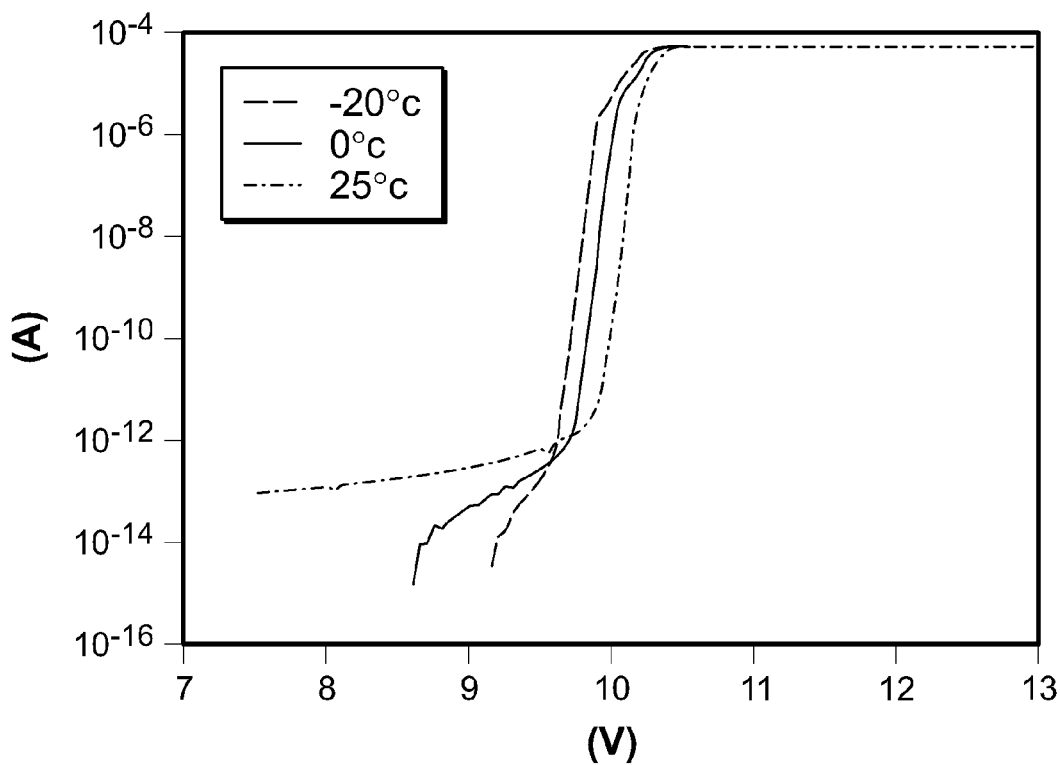
FIG. 15 is a plot of breakdown voltage of a 20 μm avalanche photodiode of the present invention for three values of temperature.

The scaling down of MOSFET transistors for use in the design of avalanche photodiodes also brings increasing doping levels both in the contact (source and drain) and the channel regions. The avalanche photodiode, which makes use of these same fabrication layers, manifests the increase in doping as a decrease in breakdown voltage, which is measured at just under 10V for the 0.18 µm process. Since the impact ionization in an avalanche photodiode decreases with increasing temperature, breakdown voltage was measured in a regulated temperature chamber at several temperatures. The devices were found to be very stable, with a shift of only 6.5 mV per degree Celsius (FIG. 15). The stability, predictability and robustness of the temperature shift for the pixel design is an important consideration for detector pixels when incorporated into systems that have to operate in natural environments with varying temperatures and is result of the specific detector structure and interface circuit design. The dark current in the device at small voltages and/or at decreased temperatures is lower than the minimum detectable signal of the electrometer used in the experiment, and therefore does not show up in the log plots of FIG. 15.

Figure 16:
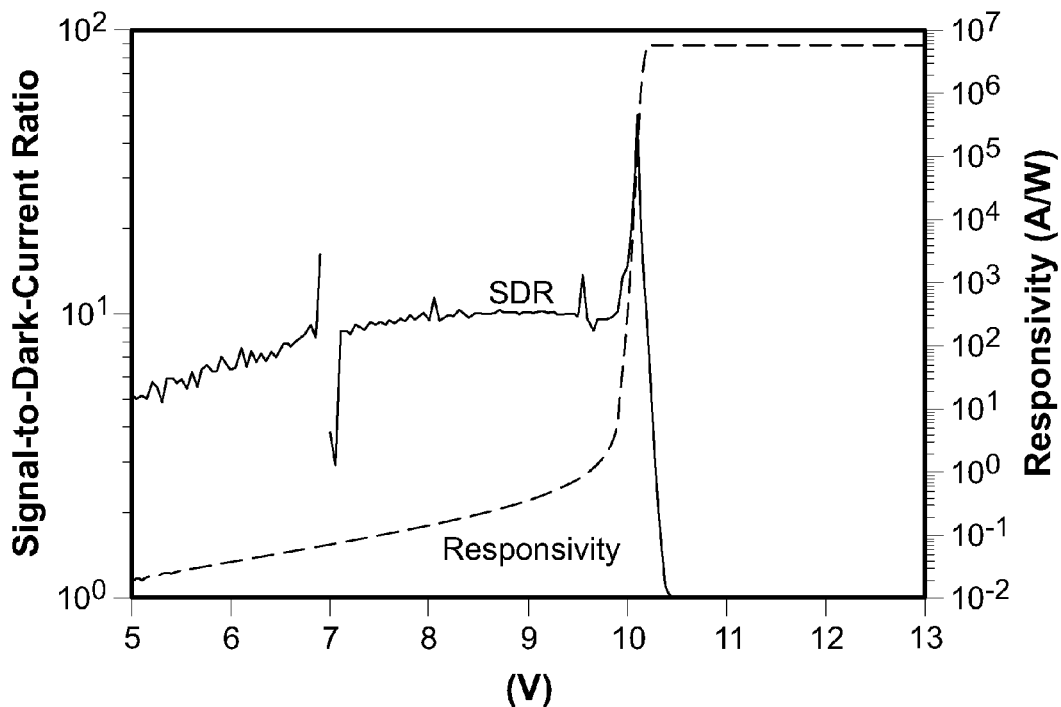
FIG. 16 is a plot of a comparison of signal to dark current ratio and the responsivity of an avalanche photodiode of the present invention illuminated at 565 nm.
Figure 17:
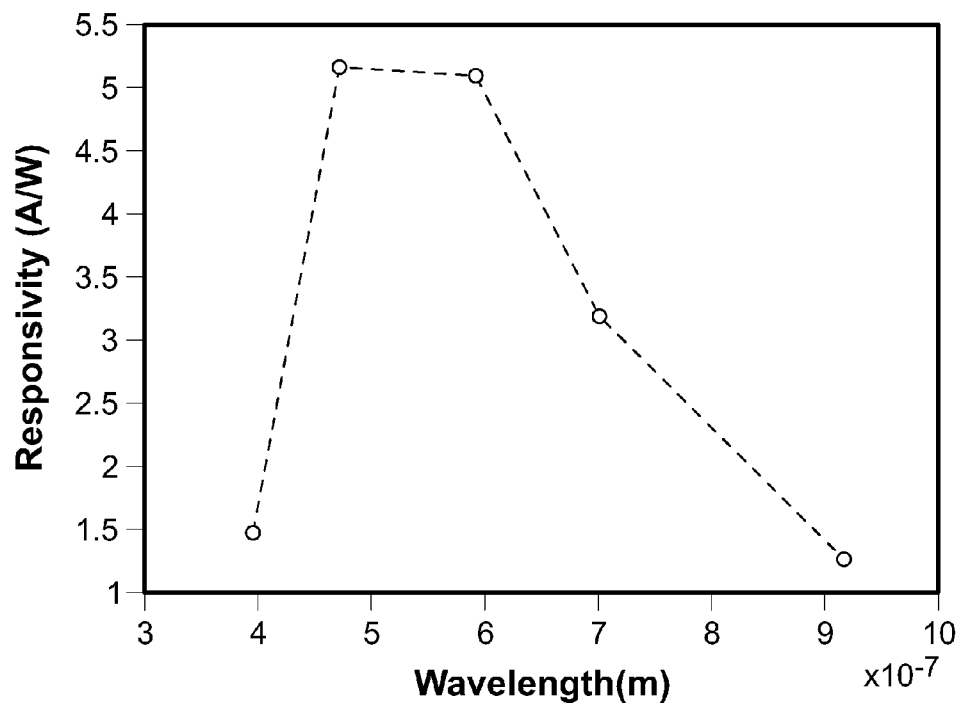
FIG. 17 is a plot of responsivity of an avalanche photodiode of the present invention which is biased below its breakdown voltage for wavelengths ranging from UV to IR.

The measurement was set to current-limit at 50 µA to protect the device. When an avalanche photodiode is used to detect single photons, it is biased anywhere from several hundred millivolts to several volts above breakdown; therefore, the temperature in the avalanche photodiode would have to drift by at least 20 degrees to have any measurable effect on the dark count or photon detection probability. The avalanche photodiodes tested were also allowed to stay in the ON state for a stretch of several hours and showed no degradation in performance, which is an important specification attributed to the specific design methodology. The detector was then illuminated using calibrated light-emitting diodes of several different wavelengths to measure its responsivity and spectral characteristics. FIG. 16 shows the measured responsivity of an avalanche photodiode for illumination with a 565 nm LED plotted on the same graph as the signal-to-dark current ratio of the photodiode with the same level of illumination. The results of illumination across several different wavelengths are compared in FIG. 17 for the avalanche photodiode biased just below breakdown.

Figure 18:
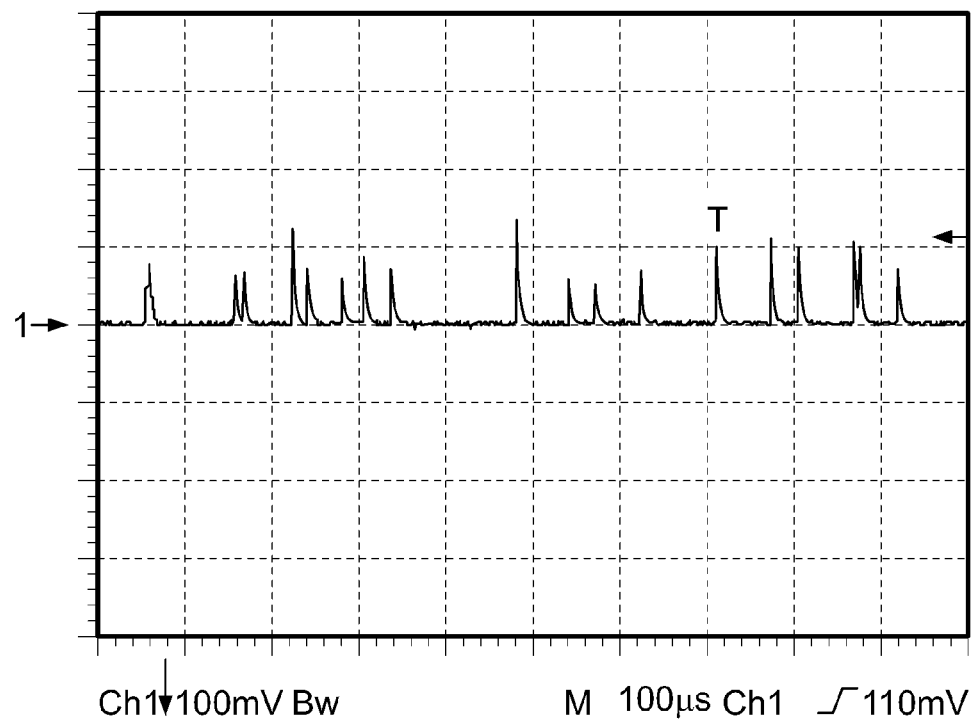
FIG. 18 is an oscilloscope trace of single-photon events.
Figure 19:
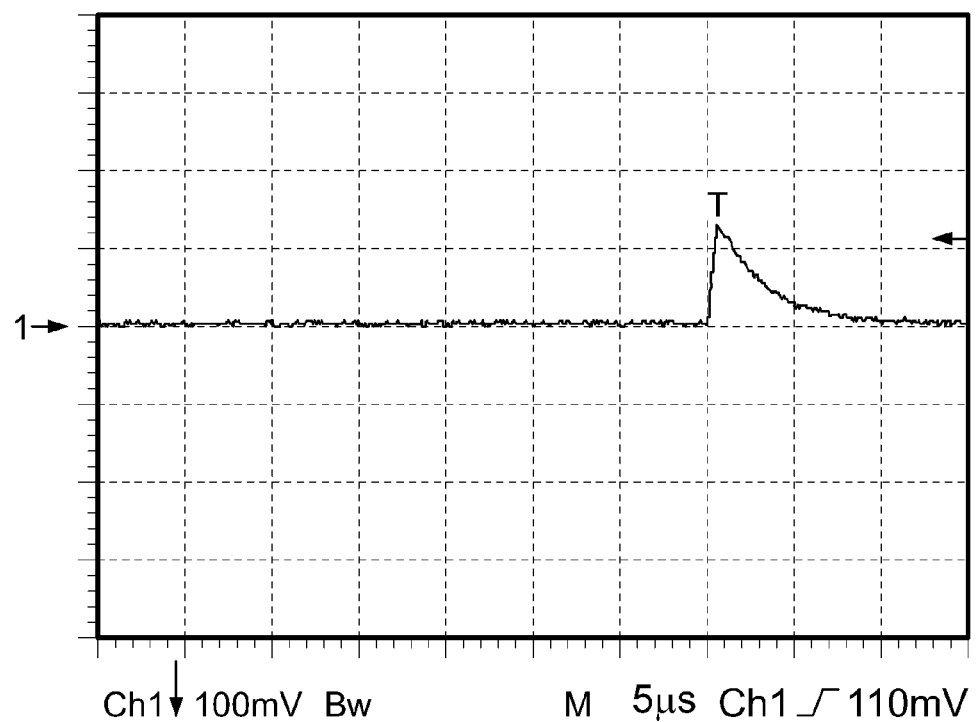
FIG. 19 is a close-up of one event depicted in FIG. 18.

An avalanche photodiode of the present invention was incorporated with a series quenching device and an output digital buffer to form a SPAD as discussed above. Analog pulses were read out through a small external resistor placed in series with the SPAD to translate the current output into voltage pulses that were then displayed on an oscilloscope. The resulting single-photon events are depicted in FIG. 18 in which a neutral density filter was used to limit the illumination of the device to 0.1% of the room light. FIG. 19 gives a closer look at the shape and temporal characteristics for one of the SPAD output pulse.

Figure 20:
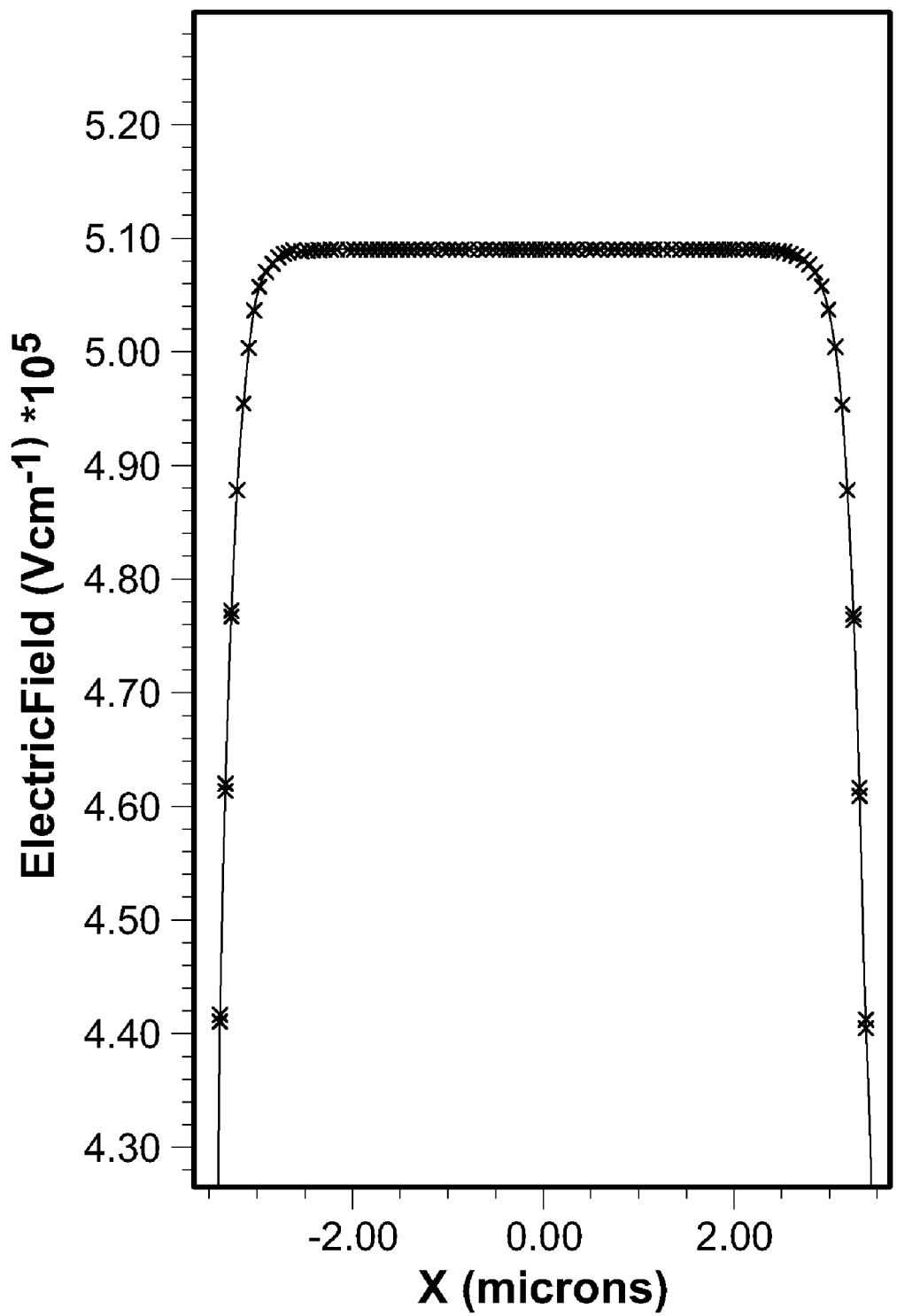
FIG. 20 shows a simulated plot of the electric field inside an avalanche photodiode of the present invention when biased at a high voltage.
Figure 21:
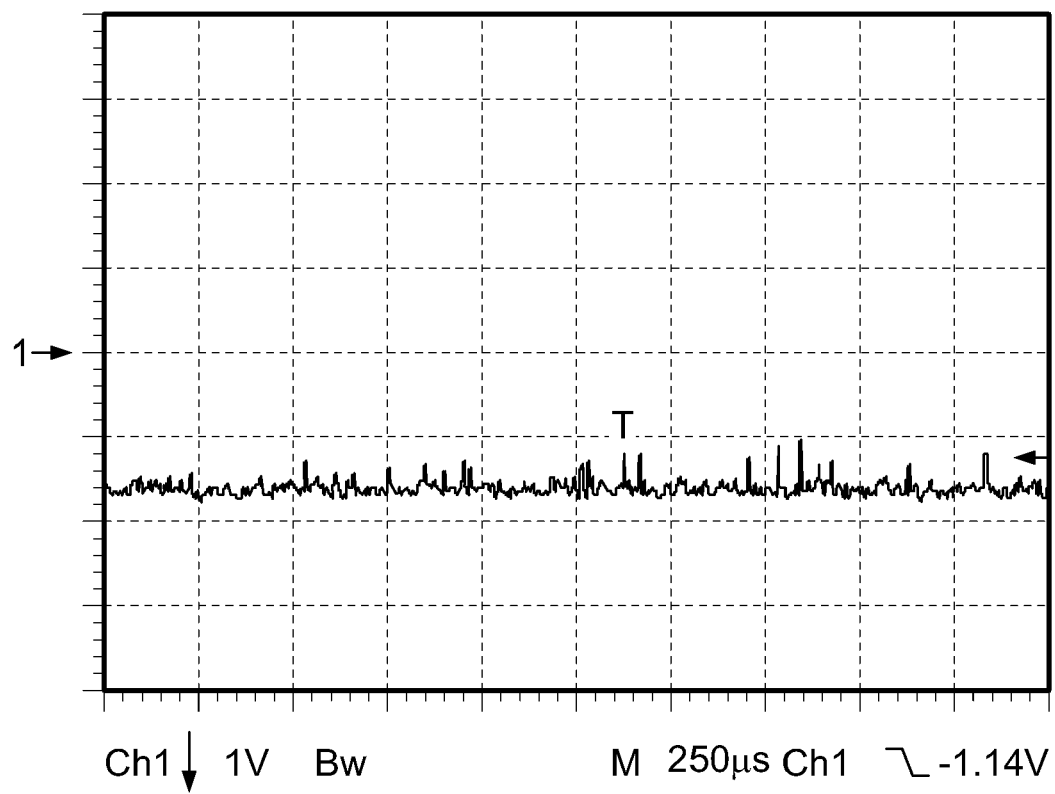
FIG. 21 is a plot of dark counts results for a test circuit incorporating a minimum-sized avalanche photodiode of the present invention.

Rise and fall times in the screenshots of FIGS. 18 and 19 are limited by the capacitances introduced by the oscilloscope. The shape of the pulses shows a very rapid onset of avalanche, followed by a fairly steep quenching of the pulse which then settles into a slower recharge of the device to its waiting state. A dark count rate of approximately 250 counts/s was measured at room temperature. Silicon avalanche photodiodes can function in Geiger mode when the impact ionization in response to an incoming photon occurs with equal probability at any point along the pn junction that forms the multiplication region of the device. Hence, the critical electric field should also occur uniformly across the junction. Premature breakdown along any edges or corners of the primary junction should be prevented so that sensitivity to incoming light is preserved and dark counts are minimized. Before fabricating the device, computational electronics simulations were performed using a Taurus-Medici device simulator to predict the electric field distribution inside a SPAD. FIG. 20 shows a simulation of the electric field inside an avalanche photodiode when biased at a high voltage, demonstrating that the design is free of edge effects that could cause leakage and premature breakdown, and that the maximum field is uniformly distributed across the active region of the device. For comparison, results of dark count measurement of a test circuit incorporating a minimum-sized avalanche photodiode not properly designed in accordance to the methodology of the present invention and procedure above with only a basic guard ring is shown in FIG. 21. The frequency of dark counts is several times higher and the device does not appear to fully reset between counts.

The pixel can be operated in multiple modes by adjusting the voltage applied to the anode of the photodiode. At voltages up to a few volts (approximately 5V), or linear mode, the pixel operates as an active pixel sensor (APS), with the unity-gain photodiode current integrated on to the input of the comparator. The intensity of the light incident on the pixel is interpreted as the time it takes to charge the voltage input of the comparator to its switching threshold. When the diode is operated at a large voltage but still below breakdown, in the device region of operation known as linear avalanche mode, the pixel behaves in a similar integrating fashion, but given that the photodiode will exhibit larger currents for the same intensity, the integration time is expected to be much smaller.

The third case is the single-photon counting mode of a SPAD, in which each photon results in a digital pulse at the output of the comparator. The linear mode is ideal for high intensity illumination, the second mode for less intense illumination (but still strong enough to saturate a detector counting each photon individually), and the third mode for extremely low light level illumination on the order of one or few photons per microsecond. Further pixel components are not required to allow for switching between modes since the anode bias is maintained as a global, tunable input voltage bias. The quenching transistor for a SPAD pixel operates as a reset transistor in the linear and linear avalanche modes, and its gate is used to globally set the start of the pixels' integration cycle in those cases (instead of maintaining a constant, static gate voltage bias as in the case of SPAD mode operation).

The multimode pixel can also be implemented with a time-to-digital converter (TDC) integrated into each pixel. The TDC consists of an event state tagging (EST) circuit of the type linear shift feedback register (LFSR) which acts as a stopwatch that is zeroed and restarted at the start of the random sequence generation (using the global reset/quenching transistor gate signal) and stopped by the rising edge output of the comparator. The contents of the LFSR in each pixel can then be read out and used as a timestamp to mark either the precise arrival time of a single-photon (as in the time-correlated single-photon counting (TCSPC) technique, or the integration time for the linear or linear avalanche mode current to reach the comparator switching threshold.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed:

1. An avalanche photodiode, comprising:
   a substrate of a first conductivity type;
   a first well of a second conductivity type formed within the substrate;
   a second well of the second conductivity type formed substantially overlying and extending into the first well;
   a heavily doped region of the first conductivity type formed substantially overlying and extending into the first well, the junction between the heavily doped region and the second well forming an avalanche multiplication region;
   a guard ring formed from a first conductivity material positioned substantially about the periphery of the multiplication region at least partially underlying the heavily doped region; and
   an outer well ring of the second conductivity type formed about the perimeter of the deep well and the guard ring.

2. The avalanche photodiode of claim 1, wherein the second well comprises an upper peripheral corner, wherein the outer well ring is positioned about the upper peripheral corner.

3. The avalanche photodiode of claim 1, wherein the first conductivity type is p-type and the second conductivity type is n-type.

4. The avalanche photodiode of claim 1, wherein an edge between the heavily doped region and a guard ring extends into the guard ring for about the full extend of the lateral doping variation of the heavily doped region.

5. The avalanche photodiode of claim 4, wherein the heavily doped region extends about half way across the guard ring.

6. The avalanche photodiode of claim 4, further comprising an anode comprising a ring formed about the edge of the heavily doped region, the anode ring being composed of combination of a heavily doped active region silicide and a stack of one or more metal vias and contacts.

7. The avalanche photodiode of claim 6, further comprising a cathode comprising a ring formed about and attached to the outer well ring, the cathode ring being composed of combination of a heavily doped active region silicide and a stack of one or more metal vias and contacts.

8. The avalanche photodiode of claim 7, further comprising bulk ring contacts formed in the substrate and extending substantially about the outer well ring.

9. The avalanche photodiode of claim 1, further comprising:
   a quenching element electrically connected to the anode; and
   a buffer electrically connected to the anode so as to form a single-photon avalanche detector (SPAD).

10. The avalanche photodiode of claim 9, wherein the quenching element is one of:
    a high-resistance polysilicon resistor,
    a thick oxide PMOS transistor, and
    a high-voltage, high-drain resistance PMOS transistor.

11. The avalanche photodiode of claim 10, further comprising a transmitter circuit configured to transmit a single-photon pulse produced by the SPAD, wherein an address of a sending pixel is communicated through an asynchronous request and acknowledgment cycle.

12. A sensor array comprising a plurality of pixel elements, wherein each of the pixel elements comprises an avalanche photodiode, wherein the avalanche photodiode is composed and constructed in accordance with the avalanche photodiode of claim 1.

13. The sensor array of claim 12, wherein each of the pixel elements further comprises:
    a quenching element electrically connected to the anode; and
    a buffer electrically connected to the anode so as to form a single-photon avalanche detector (SPAD).

14. The sensor array of claim 13, wherein the quenching element is one of:
    a high-resistance polysilicon resistor,
    a thick oxide PMOS transistor, and
    a high-voltage, high-drain resistance PMOS transistor.

15. The sensor array of claim 14, wherein each of the pixel elements further comprises a transmitter circuit configured to transmit a single-photon pulse produced by the SPAD, wherein an address of the sending pixel is communicated through an asynchronous request and acknowledgment cycle.

16. The sensor array of claim 12, wherein each of pixel elements further comprise interface and processing elements and wherein the plurality of pixel elements are controlled by computational and data routing circuits.

17. The sensor array of claim 16, wherein each of the interface and processing elements comprise:
    a sensing and amplification circuit (D);
    a gain and offset non-uniformity correction circuit (NUC); and
    an event stage tagging circuit (EST).

18. The sensor array of claim 17, wherein the computational and data routing circuits comprise:
    a peripheral processor (PP);
    asynchronous readout circuits for columns and rows (XAR, YAR, respectively);
    a global control circuit for asynchronous readout (GAR); and a global control circuit (GC).

19. The sensor array of claim 18, wherein the YAR and XAR circuits are responsible for implementing an event-based read-out scheme, whereby only a select number of pixels that have given intensity and/or temporal characteristics are read out.

20. The sensor array of claim 18, wherein the EST comprises one of a digital counter and a random number generator that includes a linear feedback shift register (LFSR) circuit whose state in incremented after each event arrives from a pixel element.

21. The sensor array of claim 18, wherein the PP further comprises an intensity mean column accumulator for each column in the PP such that when a row is selected of the plurality of pixel elements, the contents of individual pixel counts are added to their corresponding column accumulator, and when a column is selected of the plurality of pixel elements, the contents of individual column accumulators are added to the contents a global accumulator.

22. The sensor array of claim 18, wherein a scan function of the plurality of pixels outputs a pixel intensity only when the intensity falls between two predefined values embodied in two magnitude comparators incorporated in the columns of the plurality of pixels.

23. The sensor array of claim 22, further comprising a priority encoder with fixed priority for scanning the outputs of each of the plurality of pixels, the priority encoder being configured as tree structure of OR gates.

24. The sensor array of claim 18, wherein the non-uniformity correction circuit is a computational memory element.

* * * * *